US012406920B2

(12) United States Patent
Cheng et al.

(10) Patent No.: US 12,406,920 B2
(45) Date of Patent: Sep. 2, 2025

(54) TOP VIA INTERCONNECT WITH AIRGAP

(71) Applicant: INTERNATIONAL BUSINESS MACHINES CORPORATION, Armonk, NY (US)

(72) Inventors: Kenneth Chun Kuen Cheng, Shatin (HK); Koichi Motoyama, Clifton Park, NY (US); Chanro Park, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 685 days.

(21) Appl. No.: 17/651,432

(22) Filed: Feb. 17, 2022

(65) Prior Publication Data

US 2023/0260895 A1 Aug. 17, 2023

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76802* (2013.01); *H01L 21/7682* (2013.01); *H01L 23/53295* (2013.01); *H01L 21/76843* (2013.01)

(58) Field of Classification Search
CPC .......... H01L 23/5226; H01L 21/76802; H01L 21/7682; H01L 23/53295; H01L 21/76843; H01L 21/76885; H01L 21/76897; H01L 23/5222
See application file for complete search history.

(56) References Cited

U.S. PATENT DOCUMENTS

| | | | |
|---|---|---|---|
| 9,390,967 B2 | 7/2016 | Lee | |
| 9,613,861 B2 | 4/2017 | Anderson | |
| 9,984,919 B1 | 5/2018 | Zhang | |
| 10,199,263 B2 | 2/2019 | Jang | |
| 10,418,277 B2 | 9/2019 | Cheng | |
| 10,586,733 B2 | 3/2020 | Conti | |
| 10,665,546 B1 | 5/2020 | Lin | |
| 11,302,641 B2* | 4/2022 | Liao | H01L 21/7682 |
| 11,854,963 B2* | 12/2023 | Lee | H01L 21/76802 |
| 2015/0056800 A1 | 2/2015 | Mebarki | |
| 2016/0111329 A1 | 4/2016 | Zhang | |

* cited by examiner

*Primary Examiner* — Karen Kusumakar
(74) *Attorney, Agent, or Firm* — L. Jeffrey Kelly

(57) ABSTRACT

A semiconductor structure including a first metal line, a top via above and directly contacting the first metal line, a second metal line adjacent to the first metal line, a first dielectric contacting sidewalls of the top via, a second dielectric directly between the first dielectric and the second metal line, and an air gap located between the first metal line and the second metal line, and below both the first dielectric and the second dielectric.

17 Claims, 28 Drawing Sheets

Section A-A

Section B-B

SECTION C-C

Section D-D

SECTION A-A

SECTION B-B

SECTION C-C

SECTION D-D

SECTION A-A

SECTION B-B

SECTION C-C

SECTION D-D

SECTION A-A

SECTION B-B

SECTION C-C

SECTION D-D

SECTION A-A

SECTION B-B

SECTION C-C

SECTION D-D

TOP VIA INTERCONNECT WITH AIRGAP

BACKGROUND

The present invention generally relates to semiconductor interconnect structures, and more particularly, to back end of line interconnect structures with an airgap.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact formation. Layers of interconnections are formed above these logical and functional layers during the BEOL processing to complete the integrated circuit structure. As such, BEOL processing generally involves the formation of insulators and conductive wiring. The industry has typically used copper as the conductive metal for the interconnect structures most often using a dual damascene process to form a metal line/via interconnect structure.

As integrated circuits continue to reduce in size, implementing effective isolation of working components in these devices becomes more difficult. In the case of transistor structures in particular, design requirements call for effective isolation of working components to reduce negative effects such as parasitic capacitive coupling and undesirably high power consumption.

SUMMARY

According to an embodiment of the present invention, a semiconductor structure is provided. The semiconductor structure may include a first metal line, a top via above and directly contacting the first metal line, a second metal line adjacent to the first metal line, a first dielectric contacting sidewalls of the top via, a second dielectric directly between the first dielectric and the second metal line, and an air gap located between the first metal line and the second metal line, and below both the first dielectric and the second dielectric.

According to another embodiment of the present invention, a semiconductor structure is provided. The semiconductor structure may include a first metal line, a top via above and directly contacting the first metal line, a second metal line adjacent to the first metal line, a first dielectric contacting sidewalls of the top via, a second dielectric between the first dielectric and the second metal line, and an air gap located between the first metal line and the second metal line, and below both the first dielectric and the second dielectric, wherein a lateral distance between the second dielectric and the top via is smaller than a lateral distance between the first metal line and the second metal line.

According to another embodiment of the present invention, a semiconductor structure is provided. The semiconductor structure may include a first metal line, a top via above and directly contacting the first metal line, wherein the first metal line and the top via consist of a homogenous conductive material, a second metal line adjacent to the first metal line, a first dielectric contacting sidewalls of the top via, a second dielectric between the first dielectric and the second metal line, wherein a sidewall of the second dielectric directly contacts a sidewall of the second metal line, and an air gap located between the first metal line and the second metal line, and below both the first dielectric and the second dielectric, wherein a lateral distance between the second dielectric and the top via is smaller than a lateral distance between the first metal line and the second metal line.

BRIEF DESCRIPTION OF THE DRAWINGS

The following detailed description, given by way of example and not intended to limit the invention solely thereto, will best be appreciated in conjunction with the accompanying drawings, in which.

Figure 1:
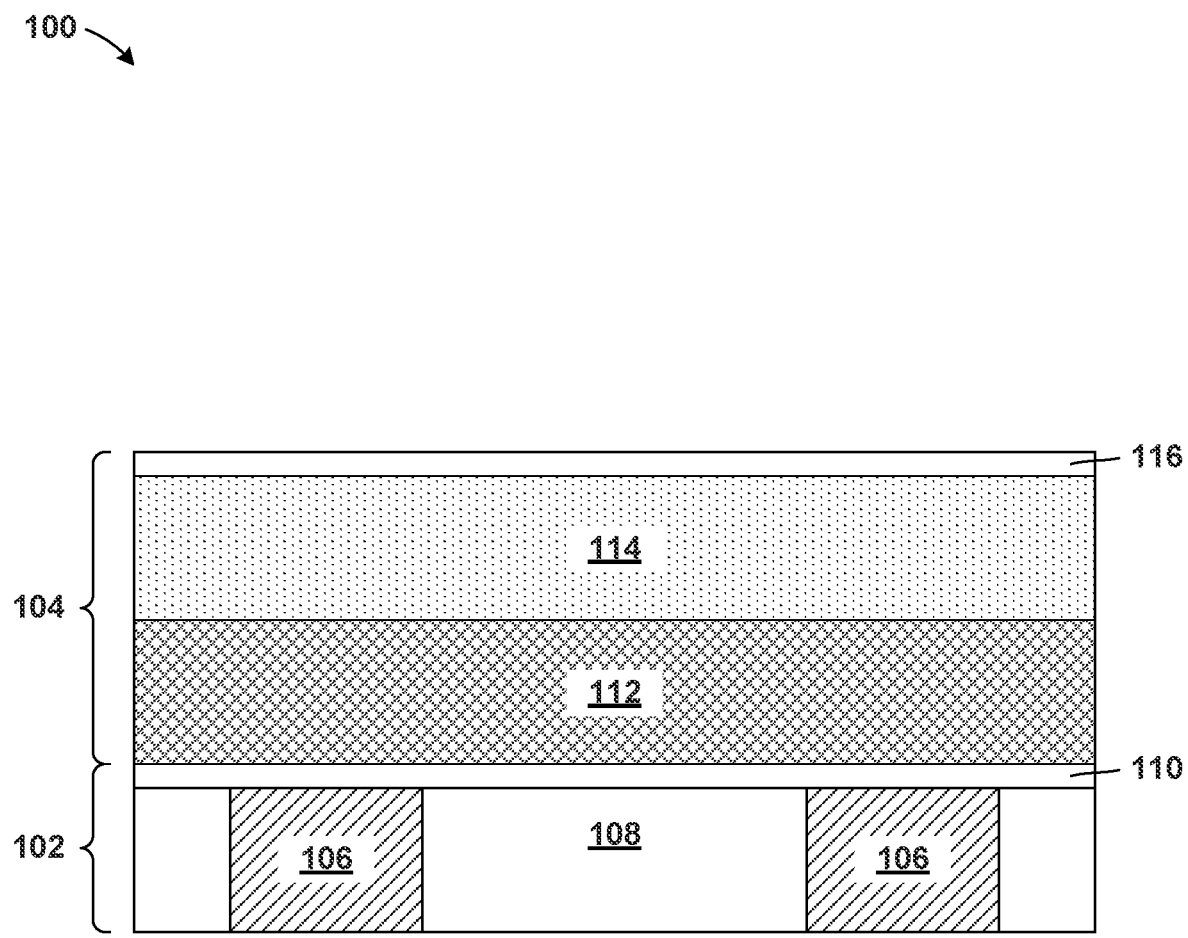
FIG. 1 is a cross-sectional view of a semiconductor structure during an intermediate step of a method of fabricating an interconnect structure according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Introducing air gaps between laterally-spaced back-end-of-line interconnects, such as, for example, top-via interconnects, can significantly reduce the parasitic capacitance and the device delay caused by this parasitic capacitance. One common way of introducing air gaps between laterally-spaced interconnects is by pinching off the space between adjacent interconnects top-via conductors with a layer of non-conformal coating; however, in doing so the coating tends to deposit on the side walls of the metal lines/vias thereby offsetting the capacitance benefits created by the air gap.

The present invention generally relates to semiconductor structures, and more particularly, to back end of line interconnect structures with an airgap. More specifically, the interconnect structures disclosed herein are specifically fabricated with beneficial air gaps without unwanted excess material covering side walls of the metal interconnects. Exemplary embodiments of air gap-containing interconnects with minimal unwanted material covering the metal trench side walls are described in detail below by referring to the accompanying drawings in FIGS. 1 to 8 Those skilled in the art will readily appreciate that the detailed description given herein with respect to these figures is for explanatory purposes as the invention extends beyond these limited embodiments.

Referring now to FIG. 1, a demonstrative illustration of a structure 100 is shown during an intermediate step of a method of fabricating an interconnect structure according to an embodiment of the invention. More specifically, as disclosed herein, the method may begin with forming an underlying level 102 followed by formation of a tri-layer template 104.

For purposes of illustration, the underlying level 102 of the present embodiment includes multiple conductors 106 formed in an interlevel dielectric layer 108, as is well known and understood by persons killed in the art. The underlying level 102 represents any one of a front-end-of-line device layer, a middle-of-line metal layer, or a back-end-of-line metal layer. The conductors 106 may be any conductor, such as, for example, lines, vias, contacts, top via contacts, etc. In at least one example, the conductors 106 represent metal lines or traces in a middle-of-line metal layer or a back-end-of-line metal layer. Additionally, one or more barrier layers (not shown) may be used to separate the conductors 106 form the interlevel dielectric layer 108 as is well known in the art. The interlevel dielectric layer 108 may include any suitable dielectric material, for example, oxide, nitride, silicon oxide ($SiO_2$), silicon nitride ($Si_3N_4$), hydrogenated silicon carbon oxide (SiCOH), carbon rich silicon carbon nitride (SiCN), silicon based low-κ dielectrics, porous dielectrics, or some combination thereof. The term "low-κ" as used herein refers to a material having a relative dielectric constant κ which is lower than that of silicon dioxide.

As illustrated, the underlying level 102 also includes a cap layer 110. The cap layer 110 can include any known etch stop material, such as, for example, silicon carbon nitride. In any case, the cap layer 110 should function as an etch stop in subsequent patterning steps and be removable selective to at least the conductors 106 and other surrounding metals.

The tri-layer template 104 is formed directly on top of the underlying level 102 and includes a metal layer 112, a dielectric layer 114, and a sacrificial layer 116 sequentially formed one on top of another. The metal layer 112 may commonly be referred to as a high modulus template and helps reduce line wiggle, or critical dimensions variations, during metal fill.

The metal layer 112 can include any metal which may be easily removed by wet etching. For example, the metal layer 112 can include aluminum, copper, ruthenium, cobalt, rhodium, iridium, nickel, or alloys thereof or the like as desired for the application. The metal layer 112 can be deposited using known techniques, such as, for example, CVD, sputtering, electrochemical deposition or like processes. In an embodiment, the metal layer 112 is made from aluminum oxide or titanium nitride because they are easily removed with known wet etching techniques. Preferably, the metal layer 112 is made from a metal which can be selectively removed as discussed in detail below with reference to FIG. 7. In an embodiment, the thickness of the metal layer 112 can range from approximately 20 nm to approximately 100 nm; however, other thicknesses lesser than 20 nm and greater than 100 nm are explicitly contemplated.

The dielectric layer 114 can include any suitable dielectric material similar to those described above with respect to the interlevel dielectric layer 108, and more specifically any silicon based low-κ dielectric. For example, in an embodiment, the dielectric layer 114 is made from hydrogenated silicon carbon oxide (SiCOH). In another embodiment, the dielectric layer 114 is made from carbon rich silicon carbon nitride (SiCN). In all cases, the dielectric layer 114 should be formed of a dielectric material that has adequate etch selectivity with respect to metals, for example the metal layer 112, as well as other subsequently formed materials as discussed below. In an embodiment, the thickness of the dielectric layer 114 can range from approximately 20 nm to approximately 100 nm; however, other thicknesses lesser than 20 nm and greater than 100 nm are explicitly contemplated.

The cumulative thickness of the metal layer 112 and the dielectric layer 114 is approximately equal a desired thickness of a typical metal-level formed on, and subsequent to, the underlying level 102. As such, the relative thickness of the metal layer 112 corresponds to a desired thickness of the metal lines and the relative thickness of the dielectric layer 114 corresponds to a desired height of the subsequently formed top vias as is described below. In some embodiments the thickness of the dielectric layer 114 is substantially equal to the thickness of the metal layer 112. In other embodiments, the dielectric layer 114 can be thicker than the metal layer 114 and provide a top via height greater than the metal line thickness. In yet other embodiments, the dielectric layer 114 can be thinner than the metal layer 112 and provide a top via height less than the metal line thickness. It is noted, that although the relative thickness of the metal layer 112 corresponds to a desired thickness of the metal lines and the relative thickness of the dielectric layer 114 corresponds to a desired height of the subsequently formed top vias, a final thickness of the metal lines and a final height of the subsequently formed top vias are not solely dependent on the relative thicknesses of either the metal layer 112 or the dielectric layer 114.

Finally, the sacrificial layer 116 can include any known dielectric hard mask materials suitable for facilitating subsequent patterning and etching techniques. For example, the sacrificial layer 116 can include nitrides, such as, silicon nitride, titanium nitride, tantalum nitride, aluminum nitride, or silicon carbon nitride. In at least one embodiment, for example, the sacrificial layer 116 is a relatively thin layer of silicon nitride. In another embodiment, the sacrificial layer 116 is a relatively thin layer of silicon carbon nitride. Finally, the sacrificial layer 116 is sacrificial in nature because it will be removed during subsequent processes and will no longer be present in the final structure.

Figure 2:
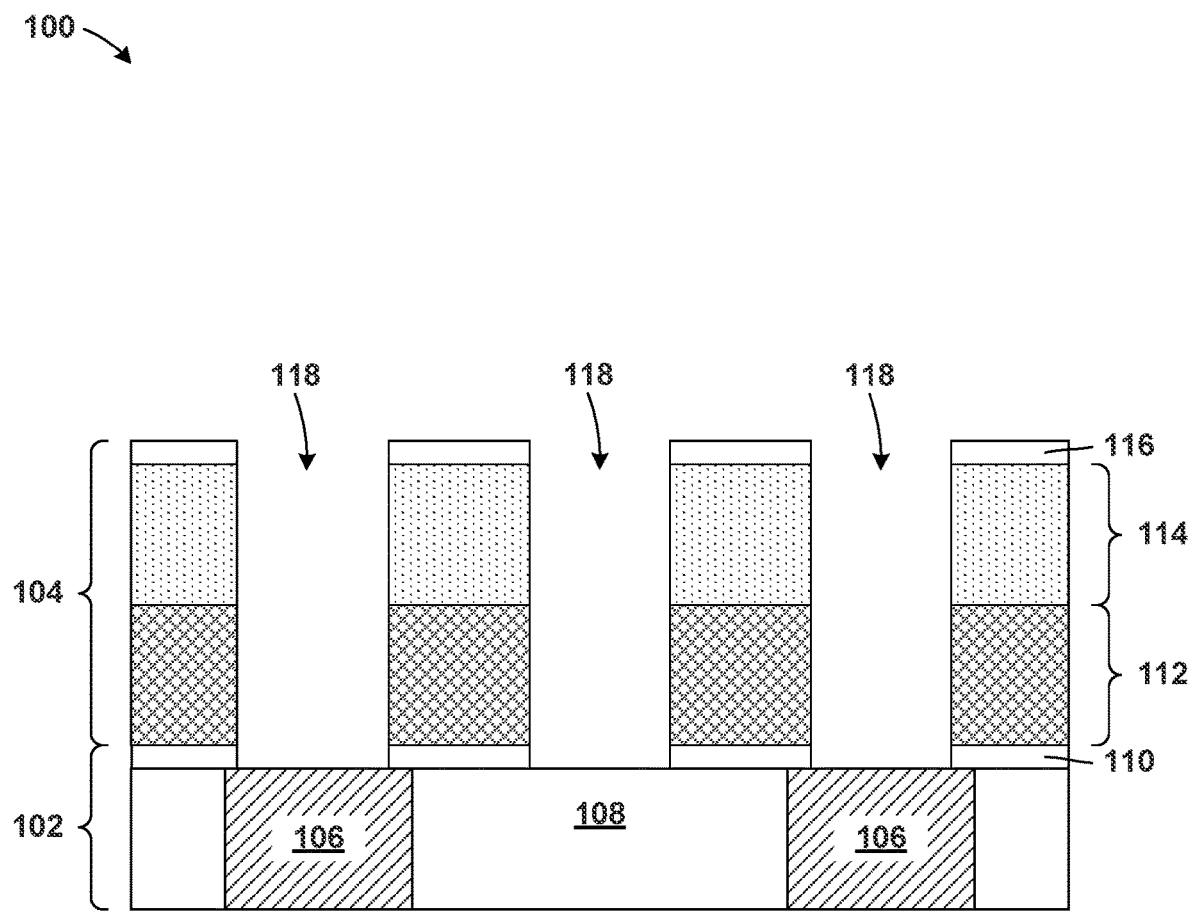
FIG. 2 is a cross-sectional view of the semiconductor structure after patterning openings in the tri-layer template according to an exemplary embodiment.

Referring now to FIG. 2, the structure 100 is shown after patterning openings 118 in the tri-layer template 104 and exposing the underlying conductors 106 according to an embodiment of the invention.

The openings 118 may be patterned in the tri-layer template 104 by applying a photoresist (not shown) to an upper surface of the sacrificial layer 116, exposing the photoresist to a desired pattern of radiation and developing the exposed photoresist utilizing a conventional resist developer. The pattern in the photoresist may then be transferred to the sacrificial layer 116, the dielectric layer 114, the metal layer 112, and the cap-layer 110 using one or more suitable etching techniques such as dry etch, wet etch, or combination of both.

In general, the openings 118 may be spaced apart according to lithography limitations, ground rules, or both. In some embodiments, the openings 118 are spaced equal distances apart; however, doing so is not required. Finally, only three openings 118 are shown in FIG. 2 for illustrative purposes only. Just as any typical semiconductor structure will have multiple back-end-of-line interconnect structures, the structure 100 of the present invention also explicitly includes multiple openings 118.

Figure 3:
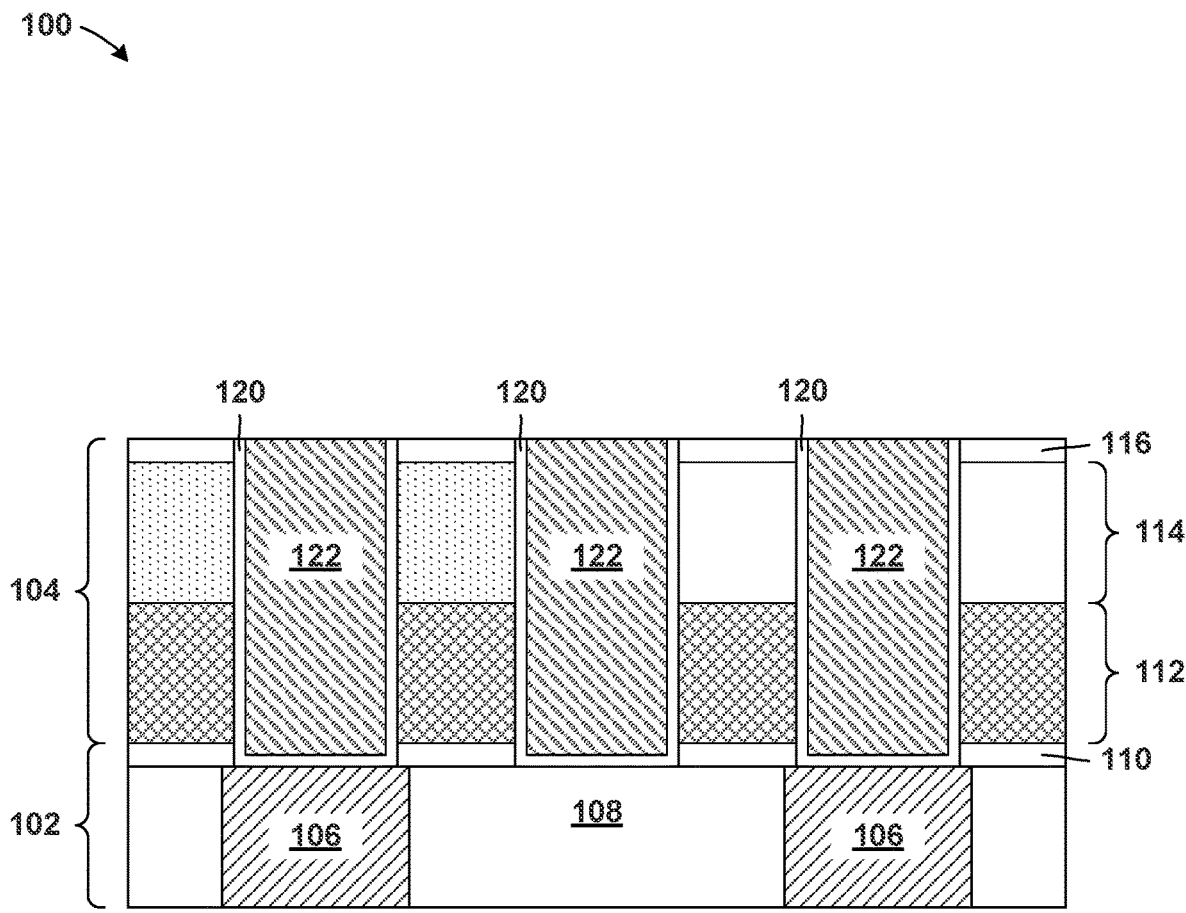
FIG. 3 is a cross-sectional view of the semiconductor structure after forming a liner and interconnects according to an exemplary embodiment.

Referring now to FIG. 3, the structure 100 is shown after forming liners 120 and interconnects 122 in accordance with an embodiment of the present invention.

As is typical of most semiconductor interconnect structures, one or more liners 120, or barrier layers, may be first deposited within the openings 118 prior to forming the interconnects 122. In an embodiment the liners 120 may include, for example, tantalum nitride (TaN), followed by an additional layer including tantalum (Ta). Alternatively, the liners 120 may include cobalt (Co) or ruthenium (Ru) either alone or in combination with any other suitable liner.

Next the openings 118 are filled with one or more conductive interconnect materials to form the interconnects 122. In the illustrated embodiment, the desired conductive interconnect material is deposited within the openings 118 directly on top of the liners 120.

The conductive interconnect material forming the interconnects 122 may include any metals which may be easily dry etched, such as, for example, cobalt, ruthenium, aluminum, tungsten or other platinum group metals. The interconnects 122 may be formed using any known technique, such as, for example, electroplating, electroless plating, chemical vapor deposition, physical vapor deposition or a combination of methods. Finally, a chemical mechanical polishing technique is used to remove excess unwanted liner material and interconnect material from upper surfaces of the structure 100.

As illustrated, the interconnects 122 are in electrical contact with the conductors 106 and form the base structure from which metal lines will be subsequently patterned from. As such, the interconnects 122 may generally have common metal line dimensions and common metal line spacing. In an embodiment, for example, the width or critical dimension of the interconnects 122 can range from approximately 10 nm to approximately 15 nm; however, other width lesser than 10 nm and greater than 15 nm are explicitly contemplated. Additionally, according to at least an embodiment, the interconnects 122 are spaced with a common line pitch, such as, for example, approximately 30 nm.

Figure 4:
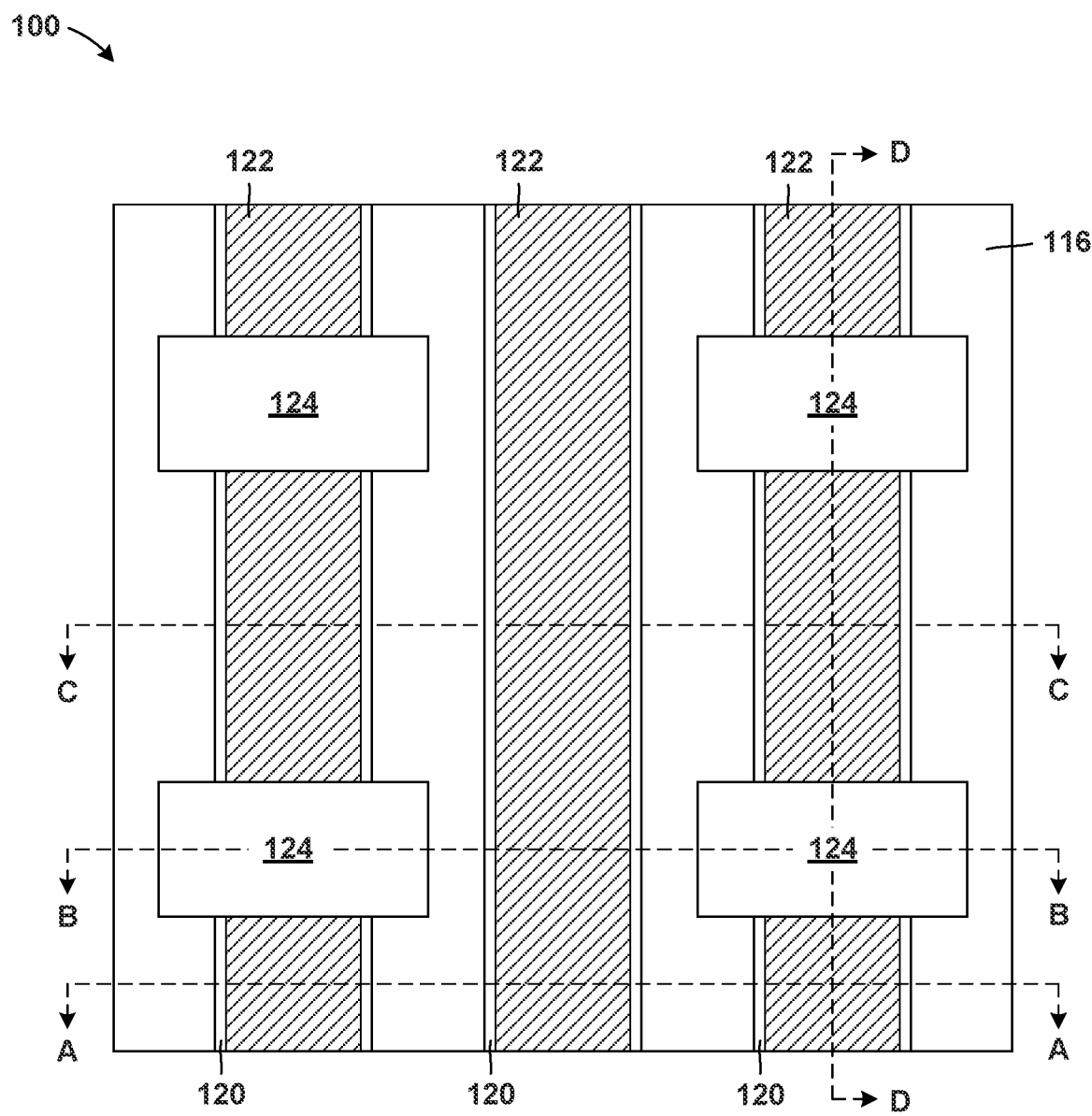
FIGS. 4, 5, 6, 7, and 8 illustrate various views of the semiconductor structure after applying masks 124 and recessing the interconnects to form lines, vias and trenches according to an exemplary embodiment.
Figure 5:
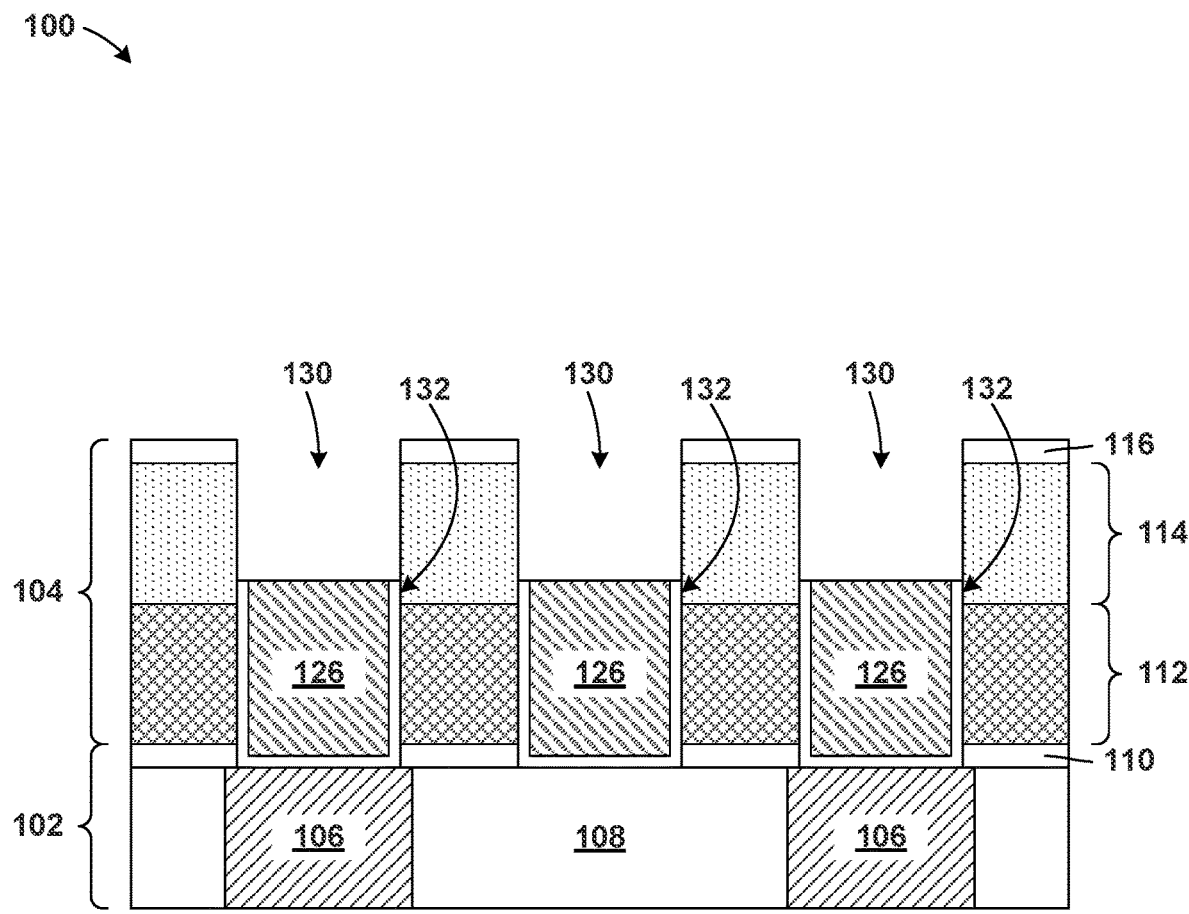
Figure 6:
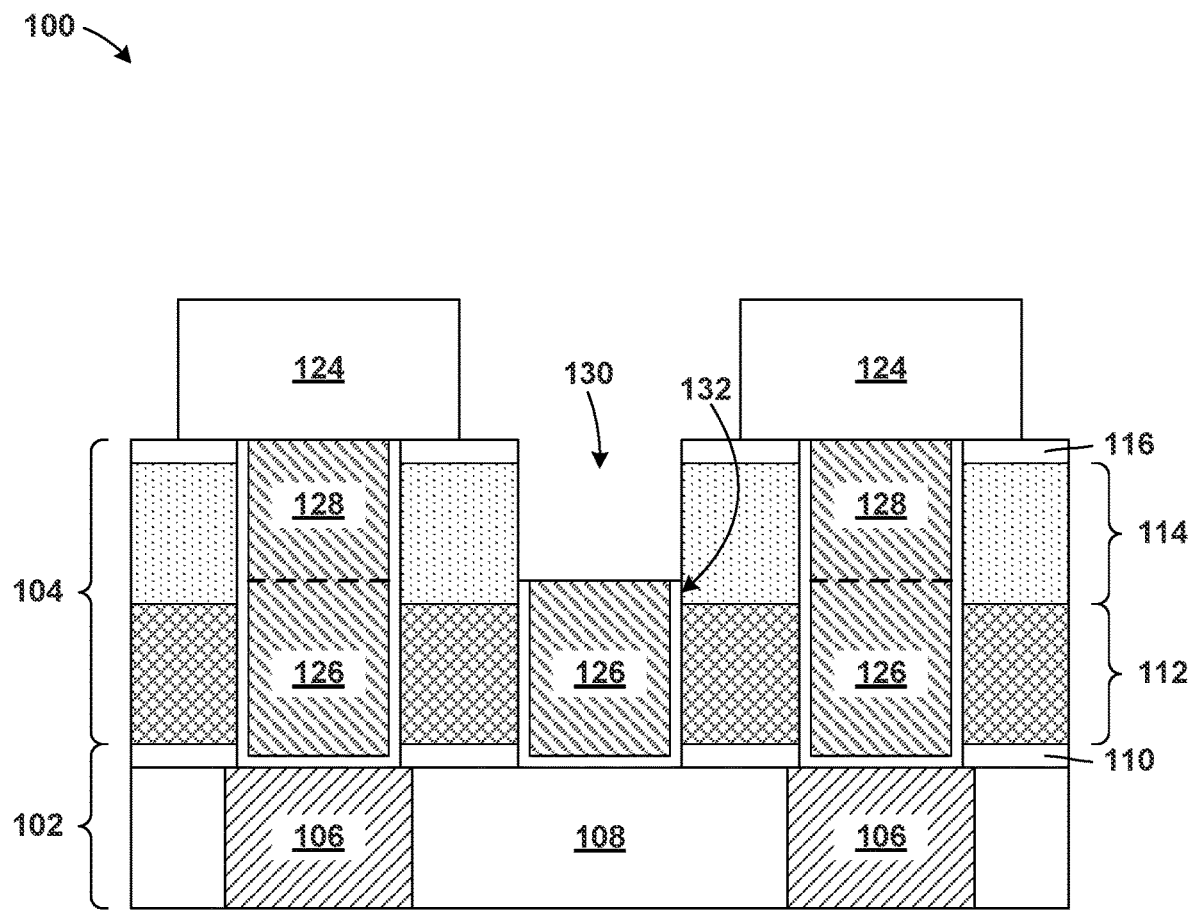
Figure 7:
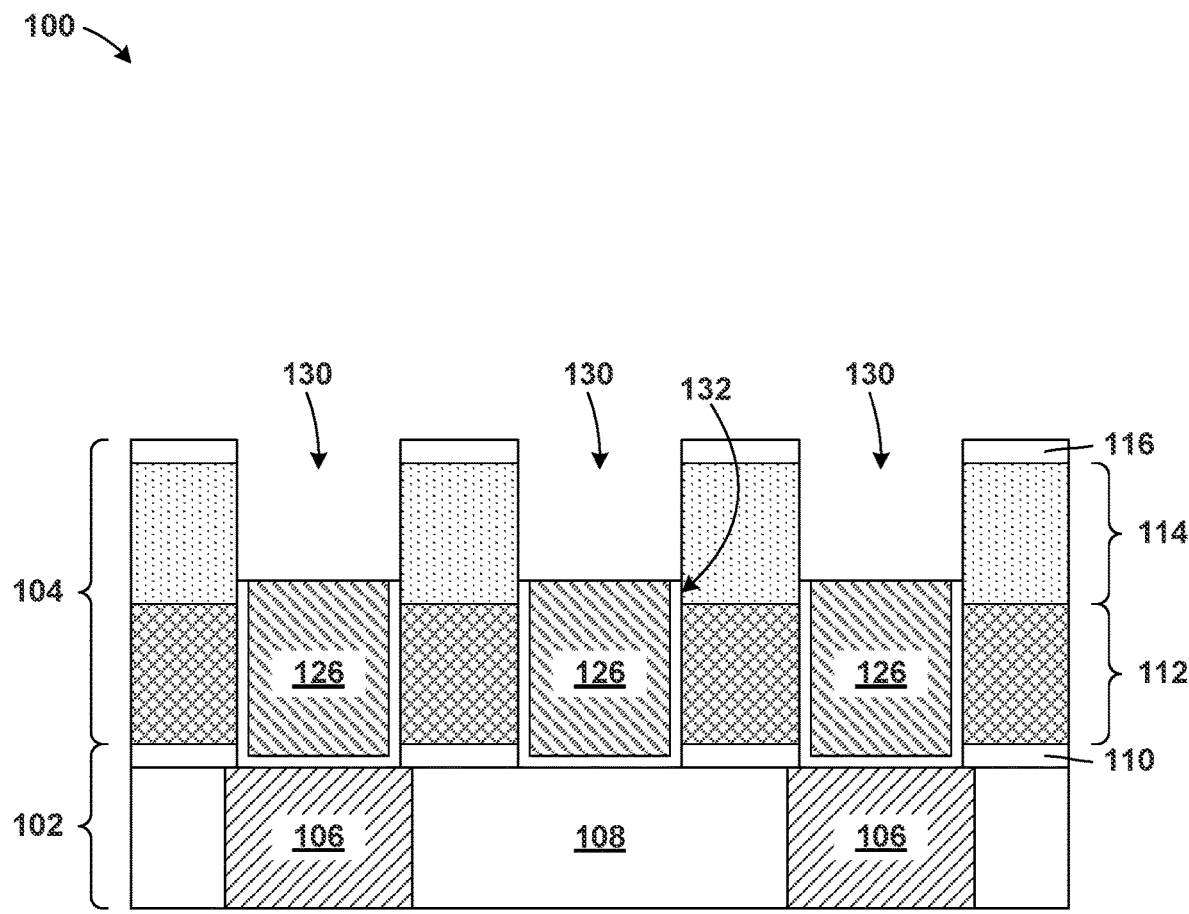
Figure 8:
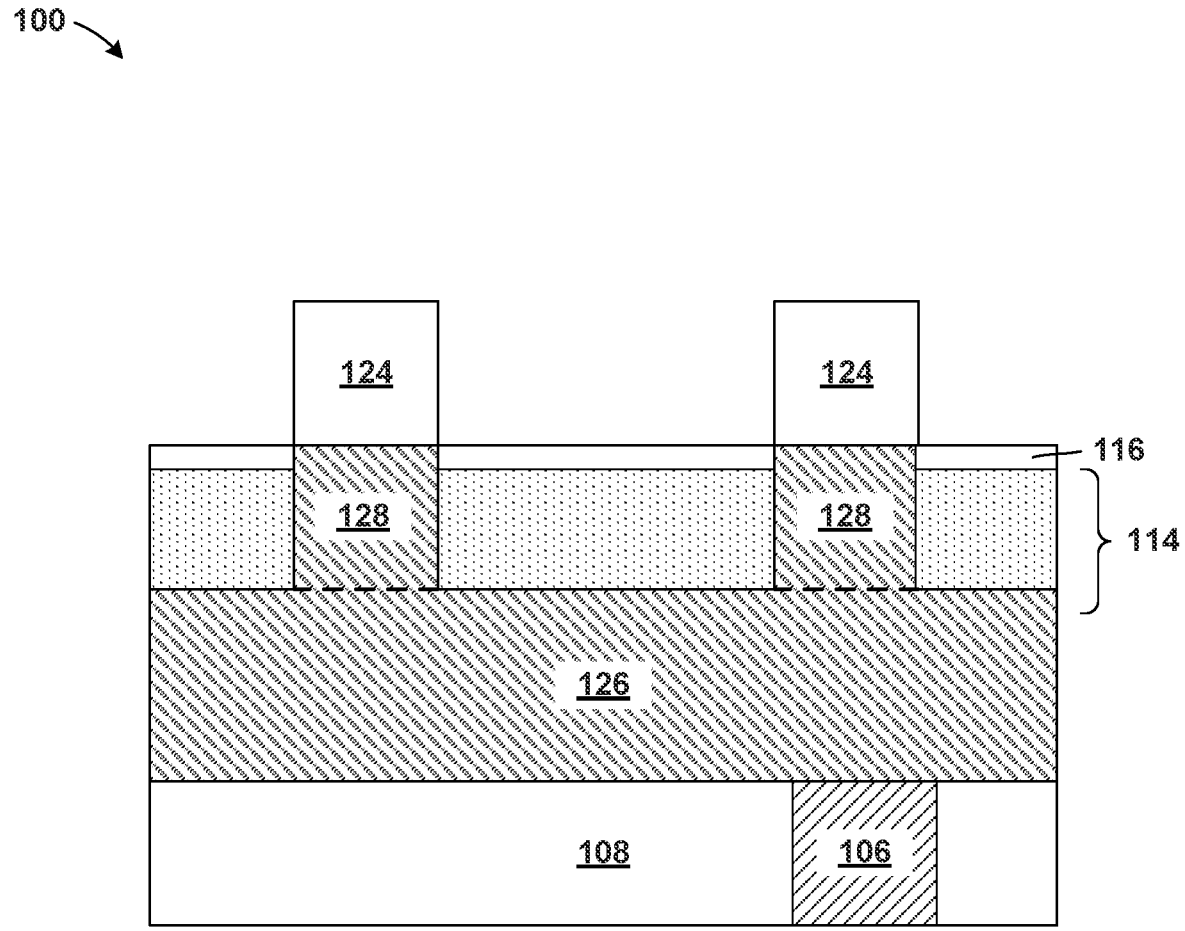

Referring now to FIGS. 4, 5, 6, 7, and 8, the structure 100 is shown after applying masks 124 and recessing the interconnects 122 to form metal lines 126, top vias 128 and trenches 130 in accordance with an embodiment of the present invention. More specifically, FIG. 4 illustrates a top view of the structure 100, FIG. 5 illustrates a cross-section view of the structure 100 along section line A-A, FIG. 6 illustrates a cross-section view of the structure 100 along section line B-B, FIG. 7 illustrates a cross-section view of the structure 100 along section line C-C, and FIG. 8 illustrates a cross-section view of the structure 100 along section line D-D. As described herein, reference to the metal lines 126 and the top vias 128 explicitly includes the liners 120, any other barrier layer, or both.

First, the masks 124 are formed using typical materials and techniques. The masks 124 are placed over portions of the structure 100 corresponding to desired via locations. For example, as illustrated in FIG. 4, masks 124 are at four via locations above the interconnects 122.

Next, exposed portions of the interconnects 122 and the liners 120 are recessed to form the metal lines 126, the top vias 128 and the trenches 130. After recessing, remaining lower portions of the interconnects 122 form the metal lines 126 and remaining upper portions of the interconnects 122, directly beneath the masks 124, form the vias 128. As such, the top vias 128 are above and directly contact the underlying metal lines 126. The metal lines 126 and the top vias 128 are referenced separately in the figures for illustrative purposes only, despite both being made from a single homogenous interconnect (122).

In contrast to typical dual damascene techniques, the metal lines 126 and the top vias 128 are subtractively formed from the interconnects 122. Further, because the top vias 128 are subtractively formed from the interconnects 122, the metal lines 126 and the top vias 128 consist of a homogenous conductive material without any barrier, liner, separation, or other interface. It is noted, the dashed line is provided in the figures for illustrative purposes only and to aid in the description of the embodiments presented herein.

In an embodiment, the interconnects 122 and the liners 120 are recessed or etched using one or more dry etching techniques. Suitable dry etching techniques may include, but are not limited to: reactive ion etching (RIE), ion beam etching, plasma etching, or laser ablation.

It is critical to maintain sidewall contact 132 between the liners 120 of the metal lines 126 and the dielectric layer 114. In doing so, portions of the interconnects 122 not protected by the masks 124 are recessed to a depth less than a combined thickness of the dielectric layer 114 and the sacrificial layer 116, as illustrated. Stated differently, after recessing an upper surface of the metal lines 126 must be above a lower surface of the dielectric layer 114. It is further noted that the recess depth directly corresponds to a resulting height of the top vias 128. Therefore, if designers need to adjust the thickness of the metal lines 126 or height of the top vias 128, further adjustments to the thickness of the metal layer 112 and the dielectric layer 114 will be needed. If the portions of the interconnects 122 are recessed below an upper surface of the metal layer 112, the dielectric layer 114 could go unsupported and collapse thereby complicating or rending subsequent processing steps impossible.

It is further noted, although the top vias 128 are illustrated with a square cross-section in some views, they may have any cross-sectional shape including, but not limited to square, rectangle, circle, ellipse.

Figure 9:
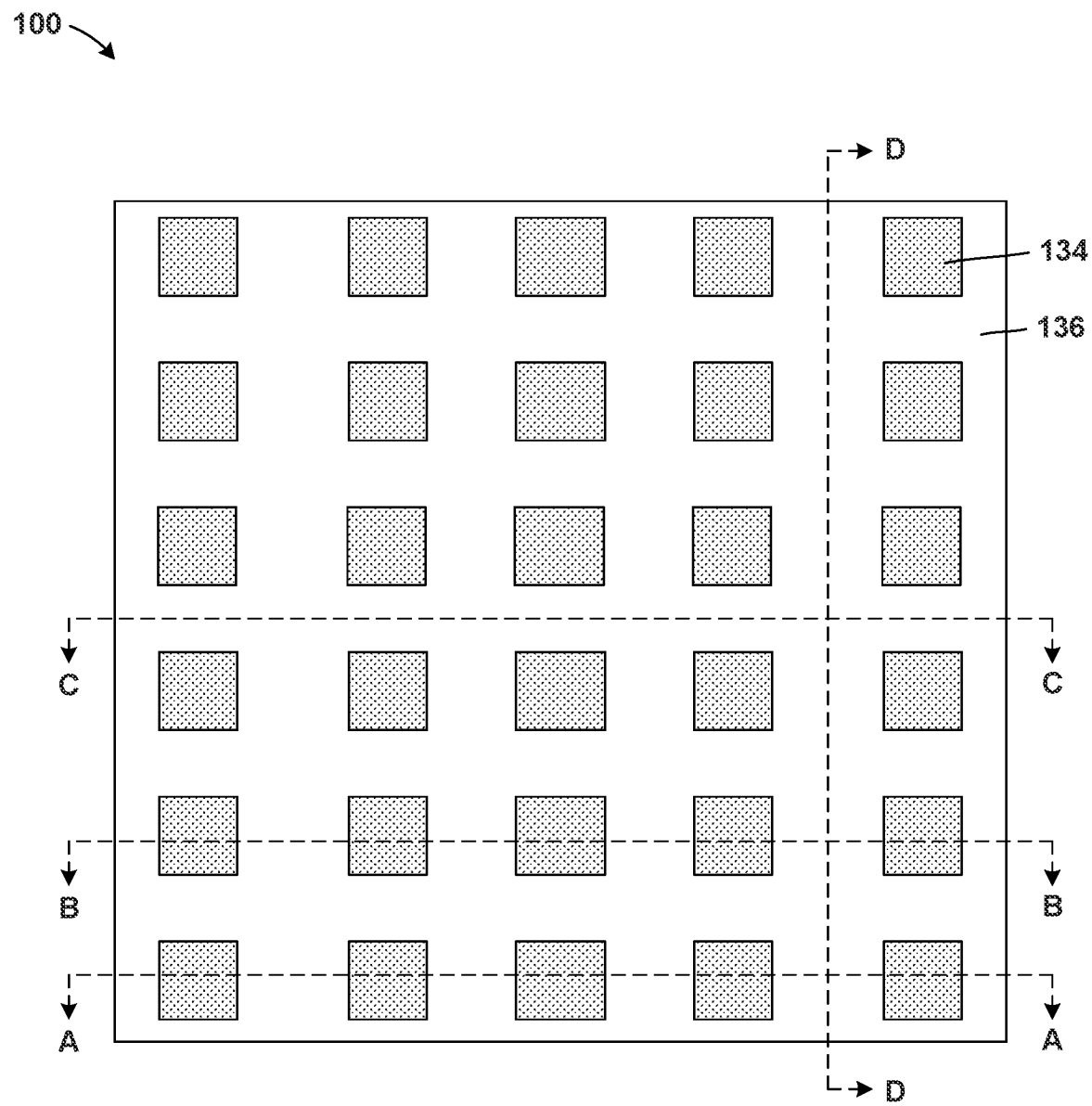
FIGS. 9, 10, 11, 12, and 13, illustrate various views of the semiconductor structure after removing the masks and the sacrificial layer followed by forming a hard mask layer and a resist layer according to an exemplary embodiment.
Figure 10:
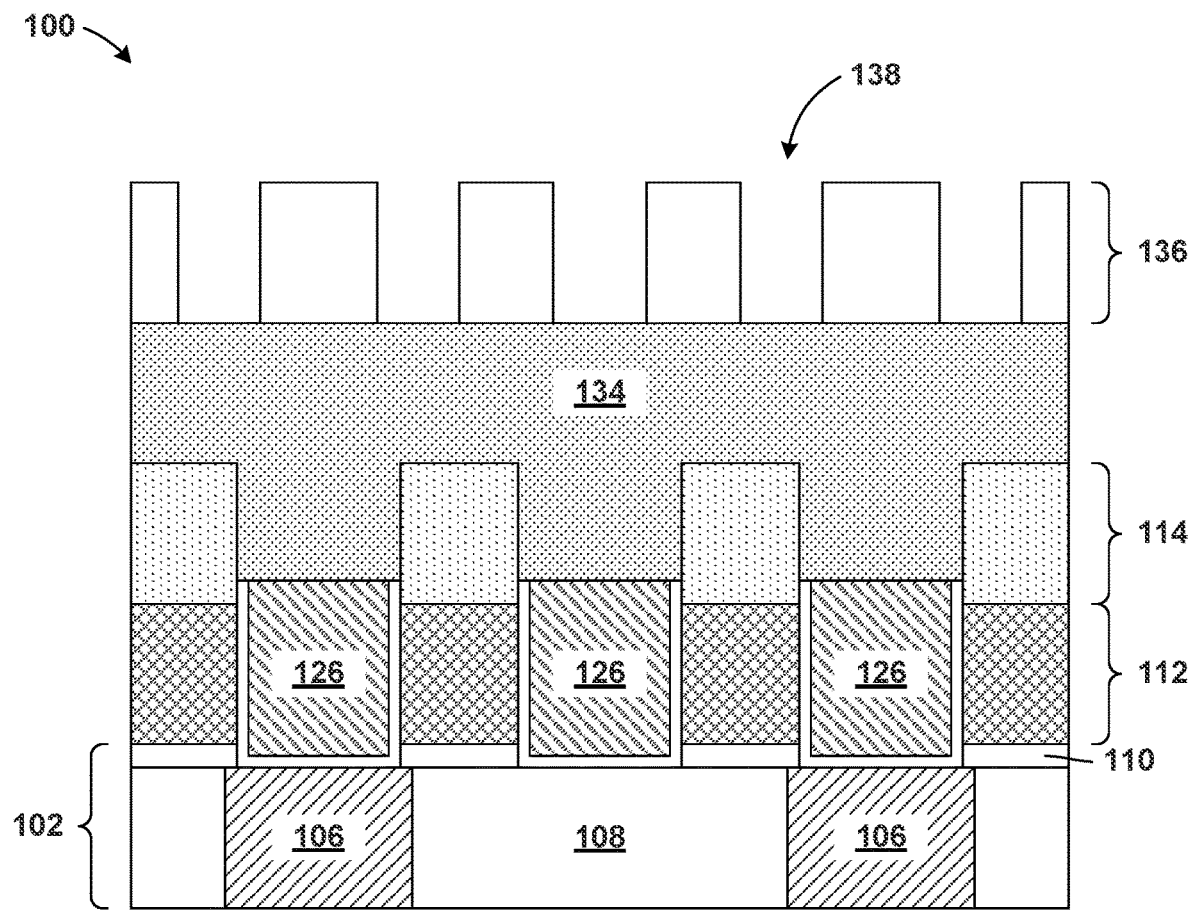
Figure 11:
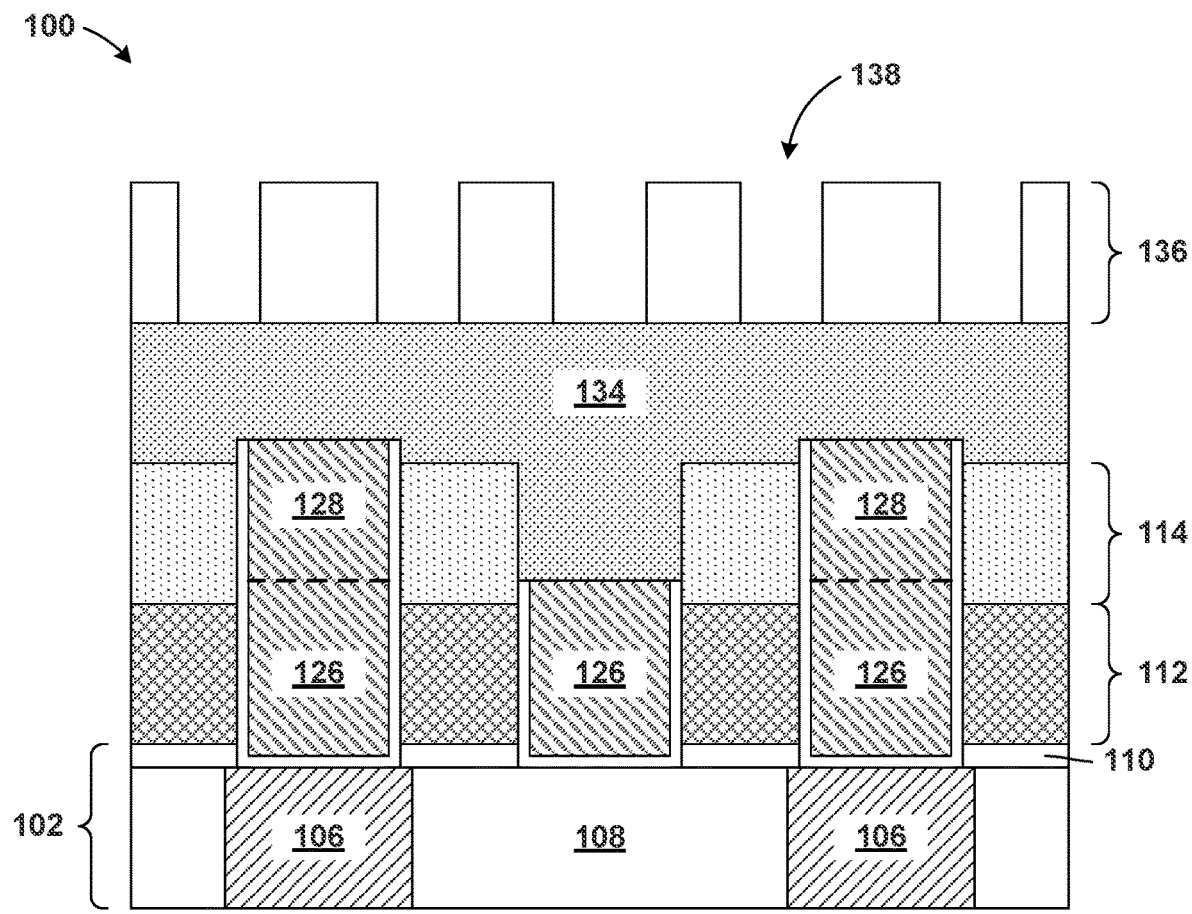
Figure 12:
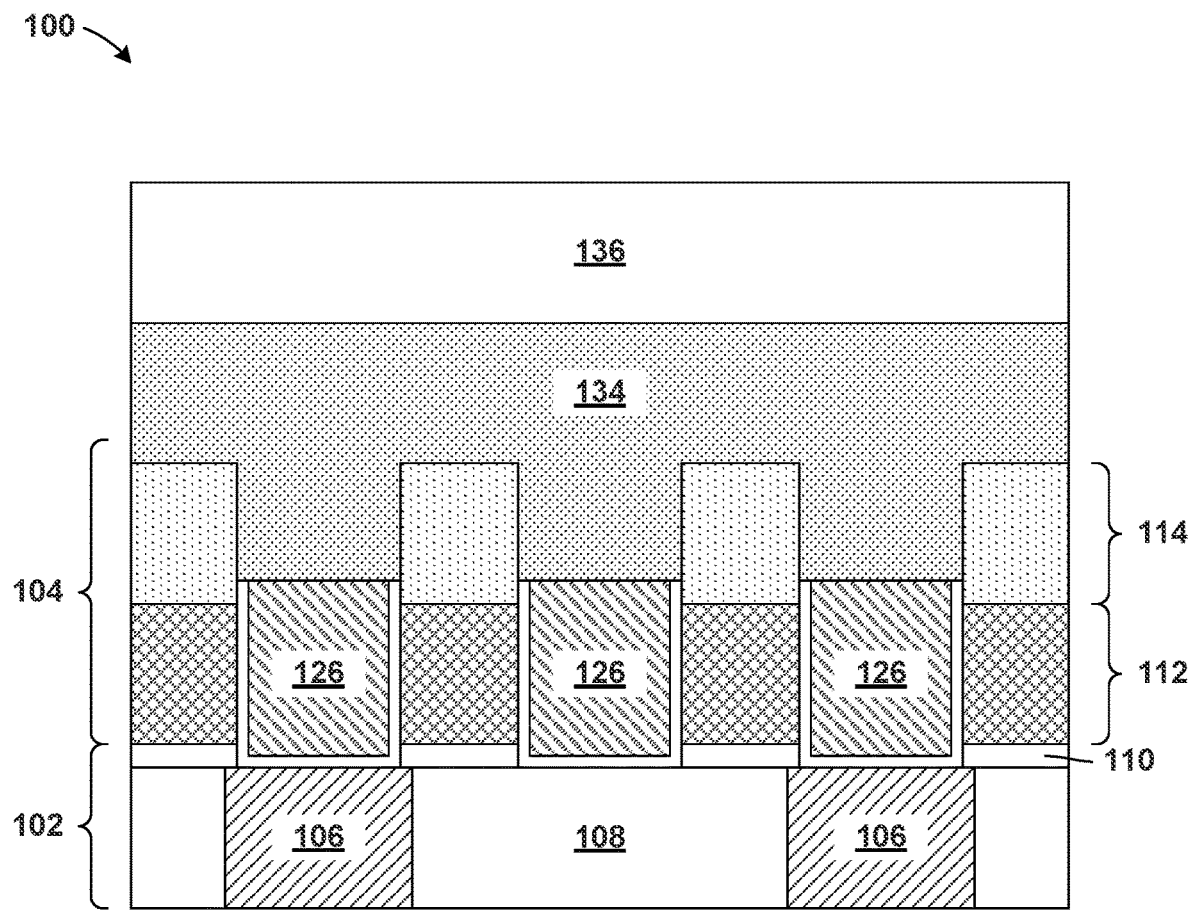
Figure 13:
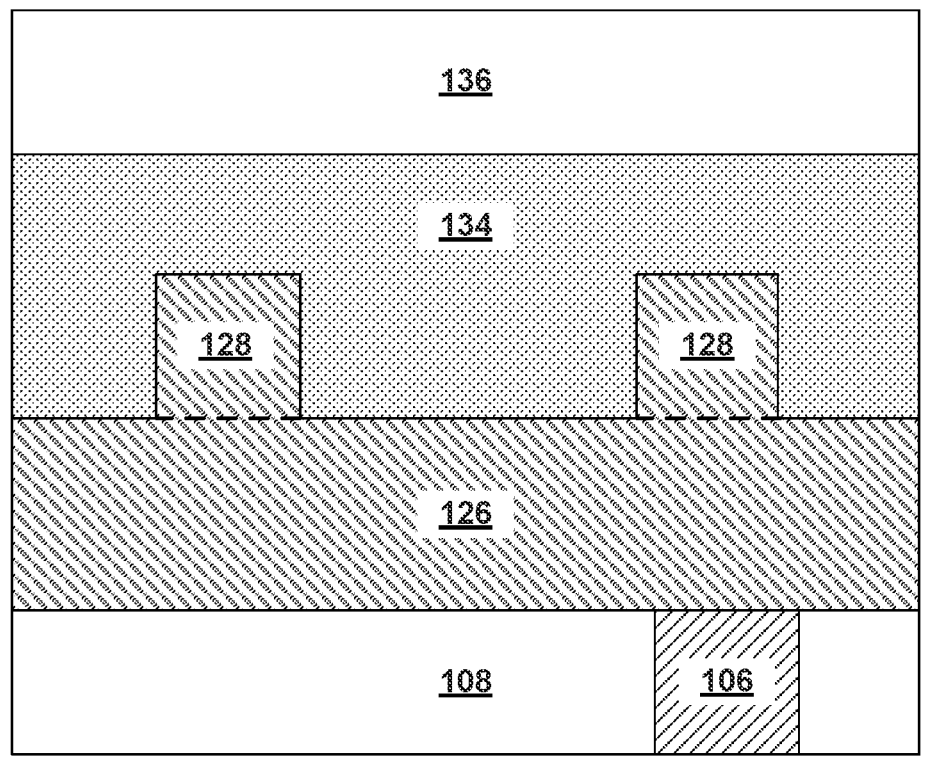

Referring now to FIGS. 9, 10, 11, 12, and 13, the structure 100 is shown after removing the masks 124 and the sacrificial layer 116 followed by forming a hard mask layer 134 and a resist layer 136 in accordance with an embodiment of the present invention. More specifically, FIG. 9 illustrates a top view of the structure 100, FIG. 10 illustrates a cross-section view of the structure 100 along section line A-A, FIG. 11 illustrates a cross-section view of the structure 100 along section line B-B, FIG. 12 illustrates a cross-section view of the structure 100 along section line C-C, and FIG. 13 illustrates a cross-section view of the structure 100 along section line D-D.

In doing so, the hard mask layer 134 is deposited directly on exposed surfaces of the structure 100, and more specifically, filling the trenches 130.

The hard mask layer 134 is composed of any known dielectric hard mask materials, such as, for example, silicon oxide or silicon nitride. In all cases, the hard mask layer 134 is preferably made from a dielectric material which is capable of being removed selective to the dielectric layer 114 and other surrounding metal features. For example, in an embodiment, the dielectric layer 114 is made from hydrogenated silicon carbon oxide (SiCOH) and the hard mask layer 134 is made from silicon nitride (SiN). In an embodiment, the dielectric layer 114 is made from carbon rich silicon carbon nitride (SiCN) and the hard mask layer 134 is made from silicon oxide ($SiO_2$).

The hard mask layer 134 can be formed by any deposition technique including, for example, chemical vapor deposition (CVD), plasma enhanced chemical vapor deposition (PECVD), physical vapor deposition (PVD), sputtering, or atomic layer deposition. In an embodiment, the hard mask layer 134 can have a thickness sufficient to fill the trenches 130 and extend above the interconnects 122 to facilitate patterning as described herein.

Next, the resist layer 136 is formed on top of the hard mask layer 134 and subsequently patterned with a block mask pattern 138. The resist layer 136 is composed of any known photo resist materials which may then be exposed a desired pattern of radiation and developed using a conventional resist developer.

Figure 14:
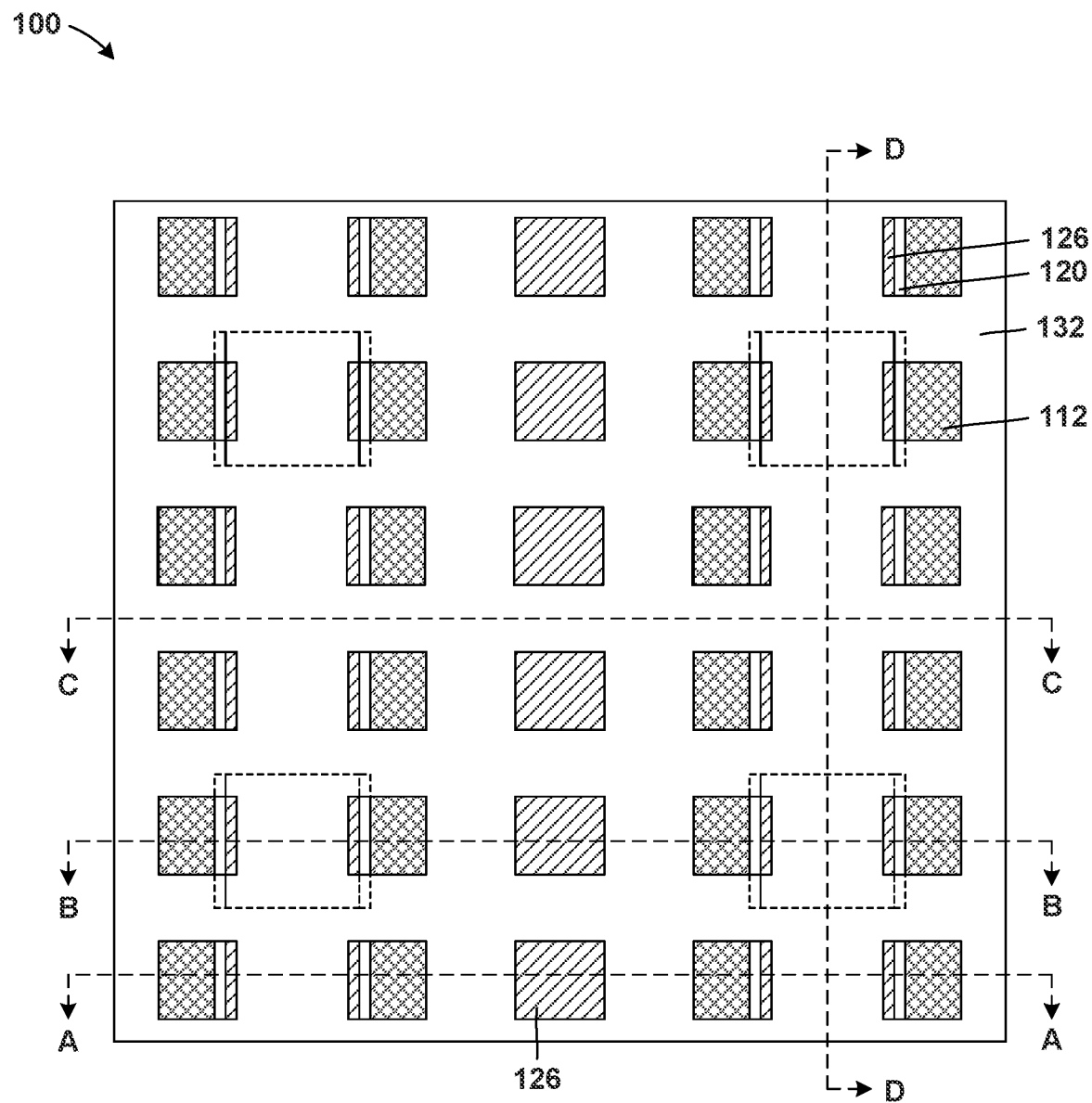
FIGS. 14, 15, 16, 17, and 18, illustrate various views of the semiconductor structure after transferring the block mask pattern into the hard mask layer and the dielectric layer according to an exemplary embodiment.
Figure 15:
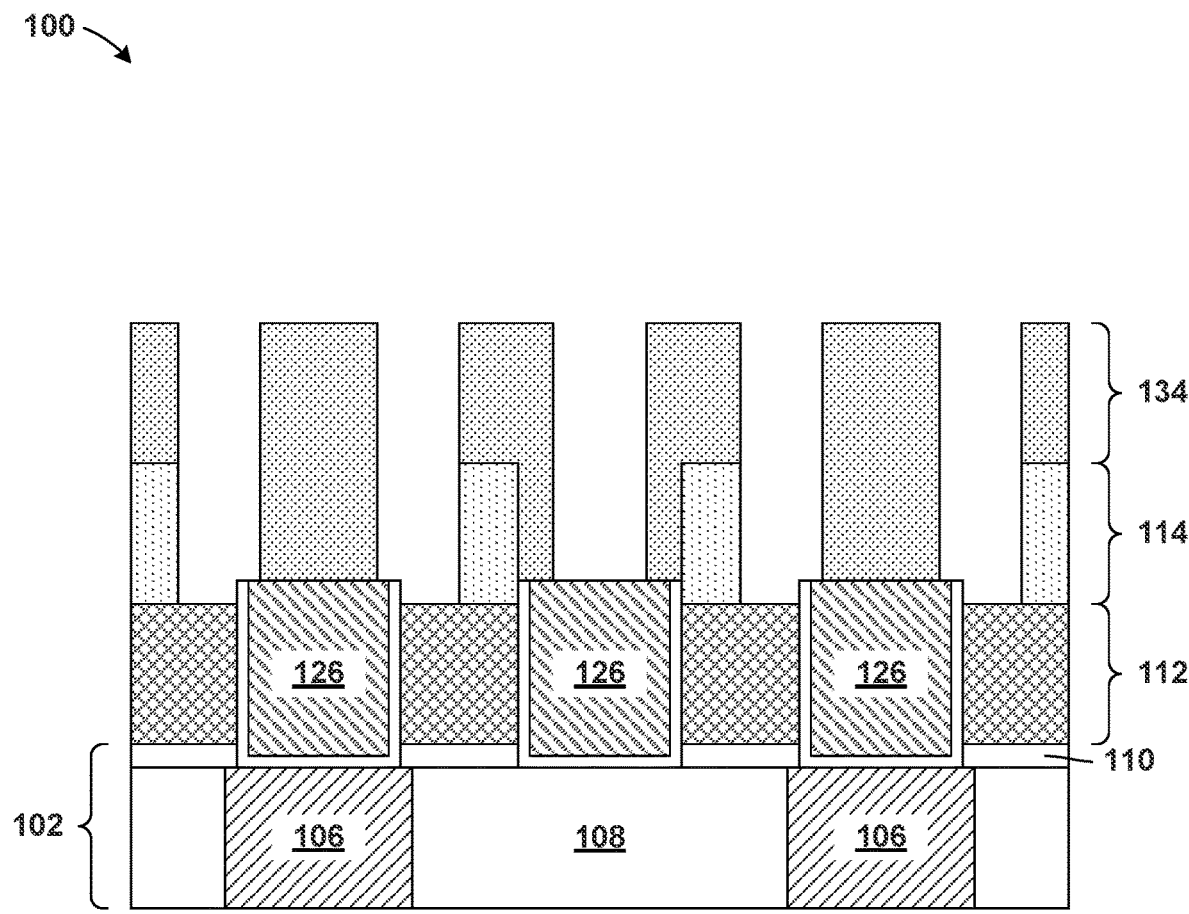
Figure 16:
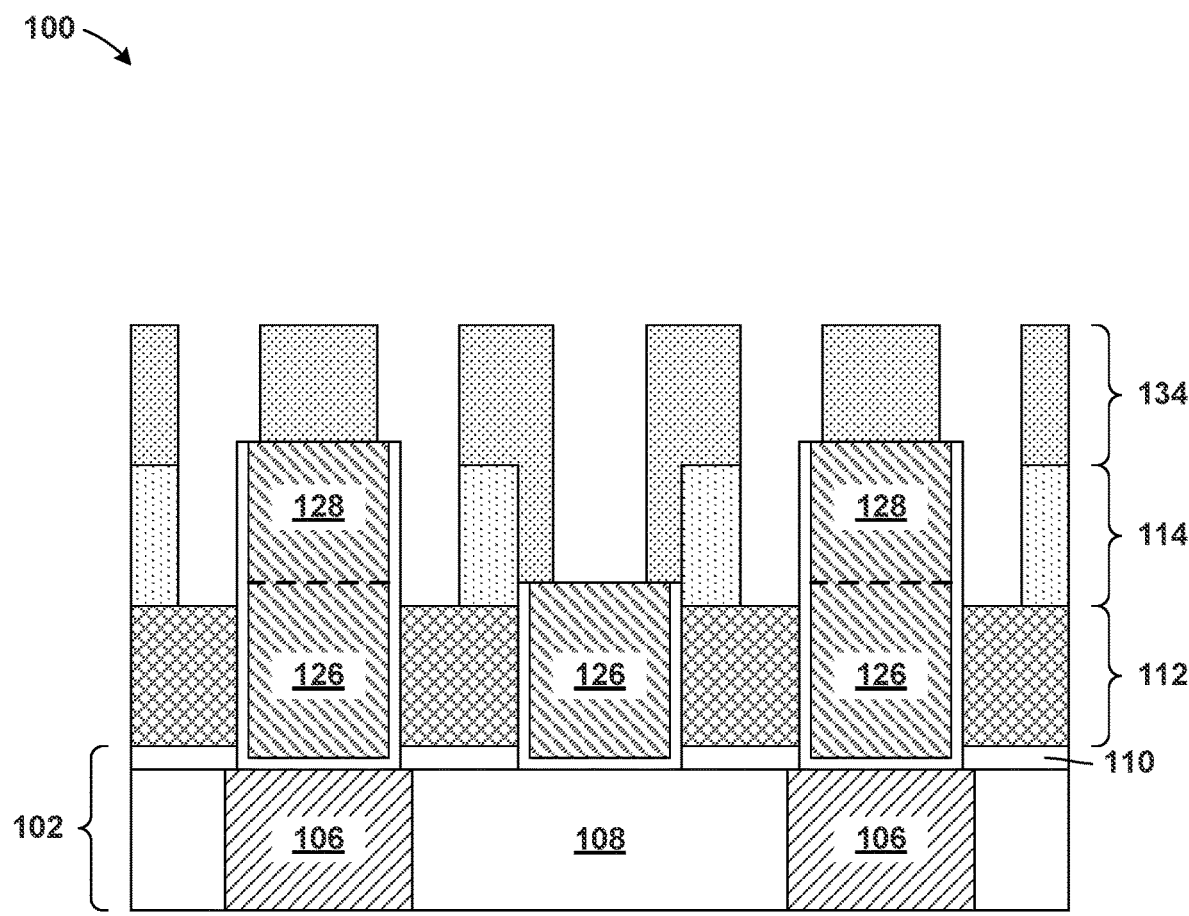
Figure 17:
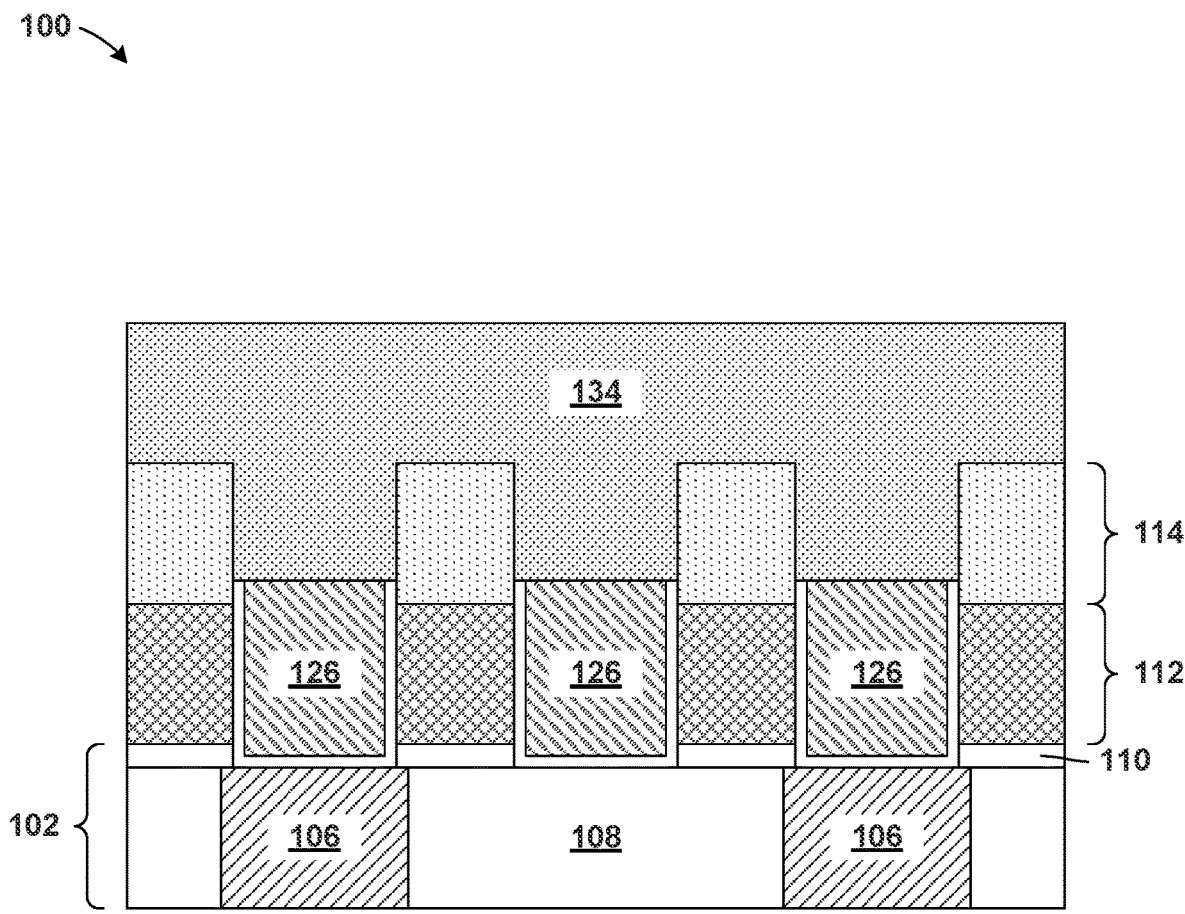
Figure 18:
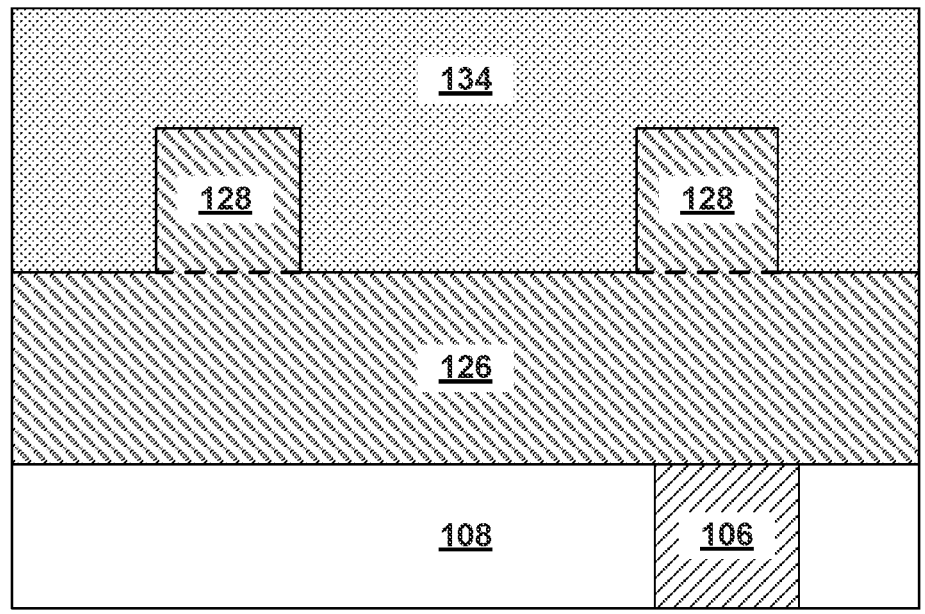

Referring now to FIGS. 14, 15, 16, 17, and 18, the structure 100 is shown after transferring the block mask pattern 138 into the hard mask layer 134 and the dielectric layer 114 in accordance with an embodiment of the present invention. More specifically, FIG. 14 illustrates a top view of the structure 100, FIG. 15 illustrates a cross-section view of the structure 100 along section line A-A, FIG. 16 illustrates a cross-section view of the structure 100 along section line B-B, FIG. 17 illustrates a cross-section view of the structure 100 along section line C-C, and FIG. 18 illustrates a cross-section view of the structure 100 along section line D-D. As illustrated, section views A-A and B-B are aligned with the block mask pattern 138, while sections views C-C and D-D are not.

In doing so, the block mask pattern 138 in the resist layer 136 is transferred using one or more dry etching techniques. Suitable dry etching techniques may include, but are not limited to: reactive ion etching (RIE), ion beam etching, plasma etching, or laser ablation. As part of transferring the block mask pattern 138, the resist layer 136 is removed using known techniques. More specifically, portions of the hard mask layer 134 and the dielectric layer 114 are etched and removed selective to the liners 120 the interconnects 122 and the metal layer 112.

The block mask pattern 138 can be any shape or pattern so long as it provides some access window to or otherwise exposes upper surfaces of the metal layer 112. Furthermore, some misalignment of the block mask pattern 138 is tolerable so long as a small portion of the metal layer 112 is sufficiently exposed to facilitate wets removal, but equally small enough to facilitate air gap formation as described below. If the access window created by the block mask pattern 138 is too big, or too wide, subsequent air gap formation may be affected. In some embodiments, the block mask pattern 138 may allow for the metal layer 112 to be exposed between all adjacent interconnects (122) across an entire wafer, or at least across an entire region of the wafer.

Figure 19:
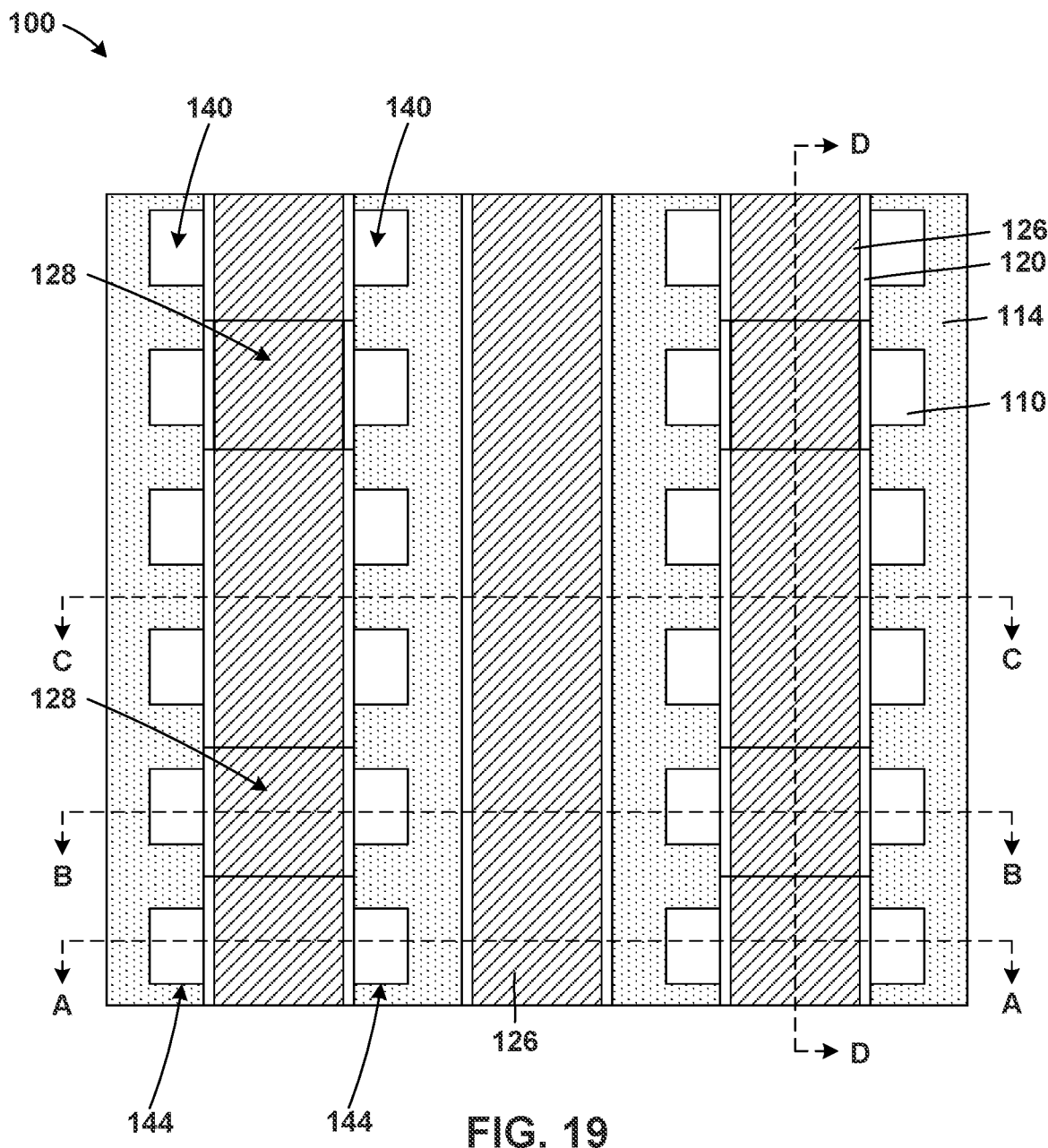
FIGS. 19, 20, 21, 22, and 23, illustrate various views of the semiconductor structure after removing hard mask layer and subsequently removing the metal layer to form voids and trenches according to an exemplary embodiment.
Figure 20:
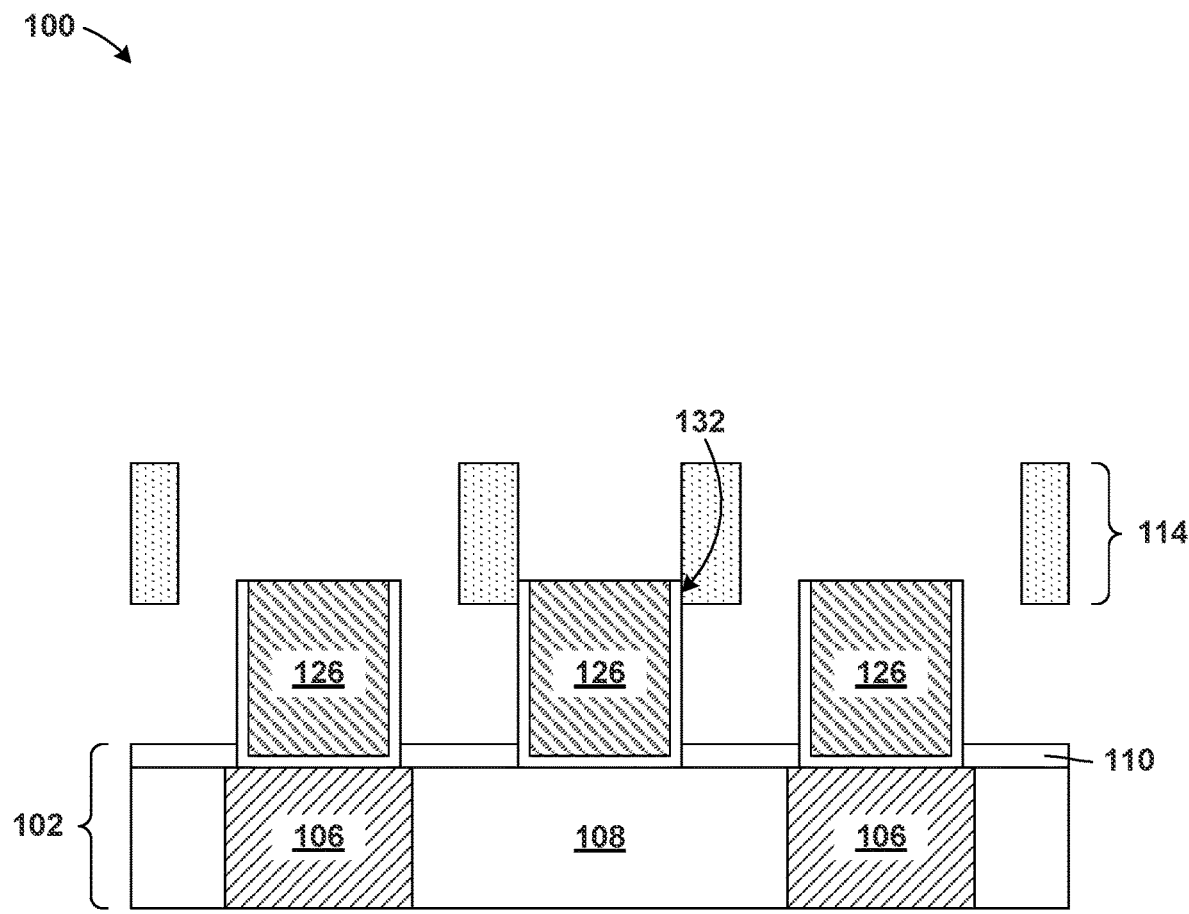
Figure 21:
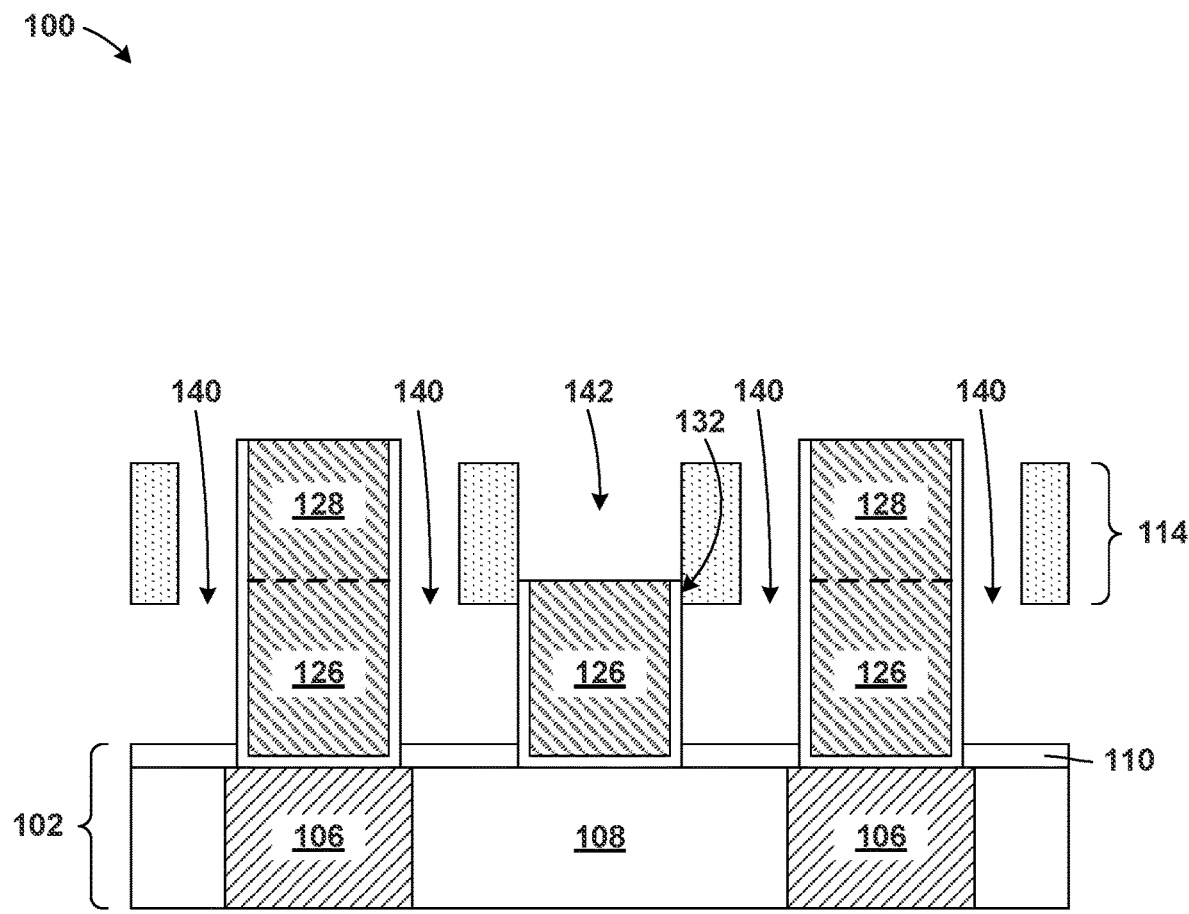
Figure 22:
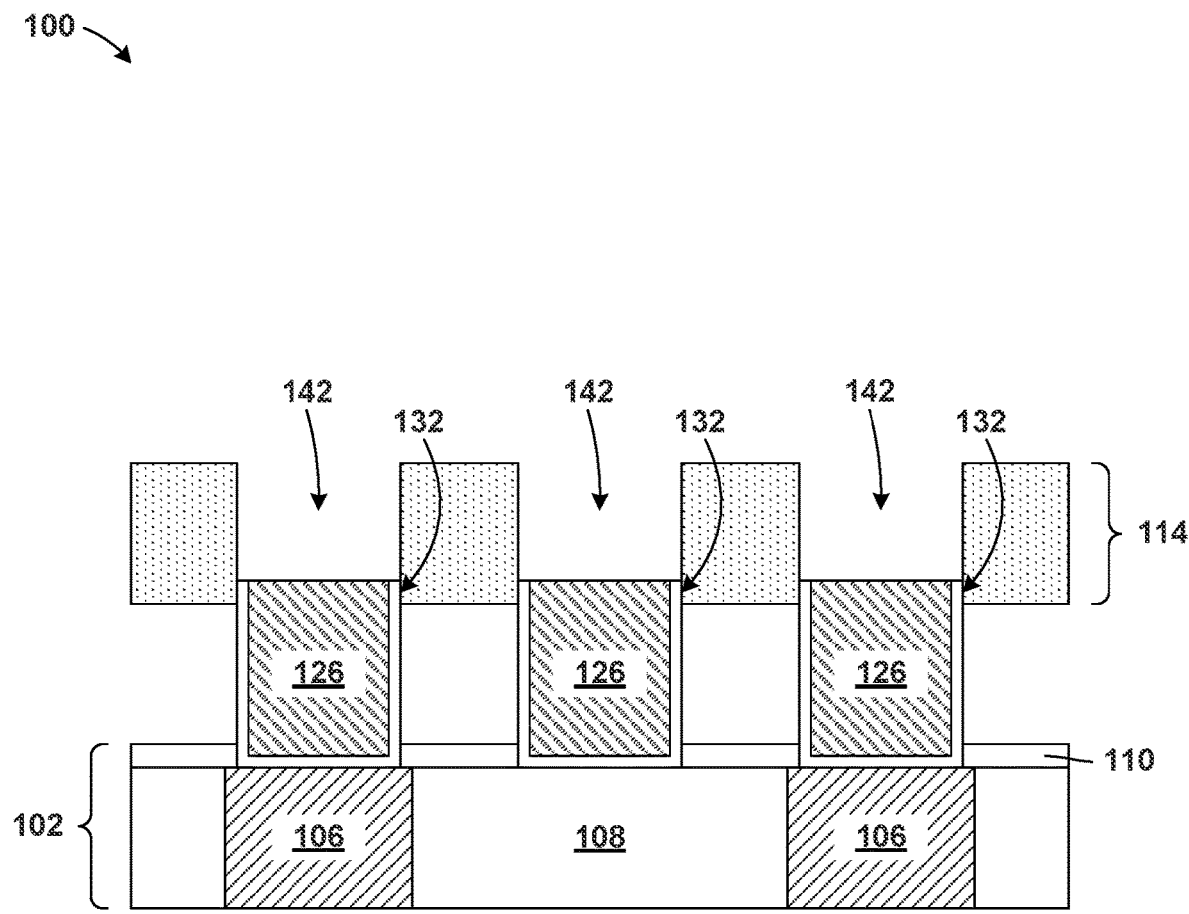
Figure 23:
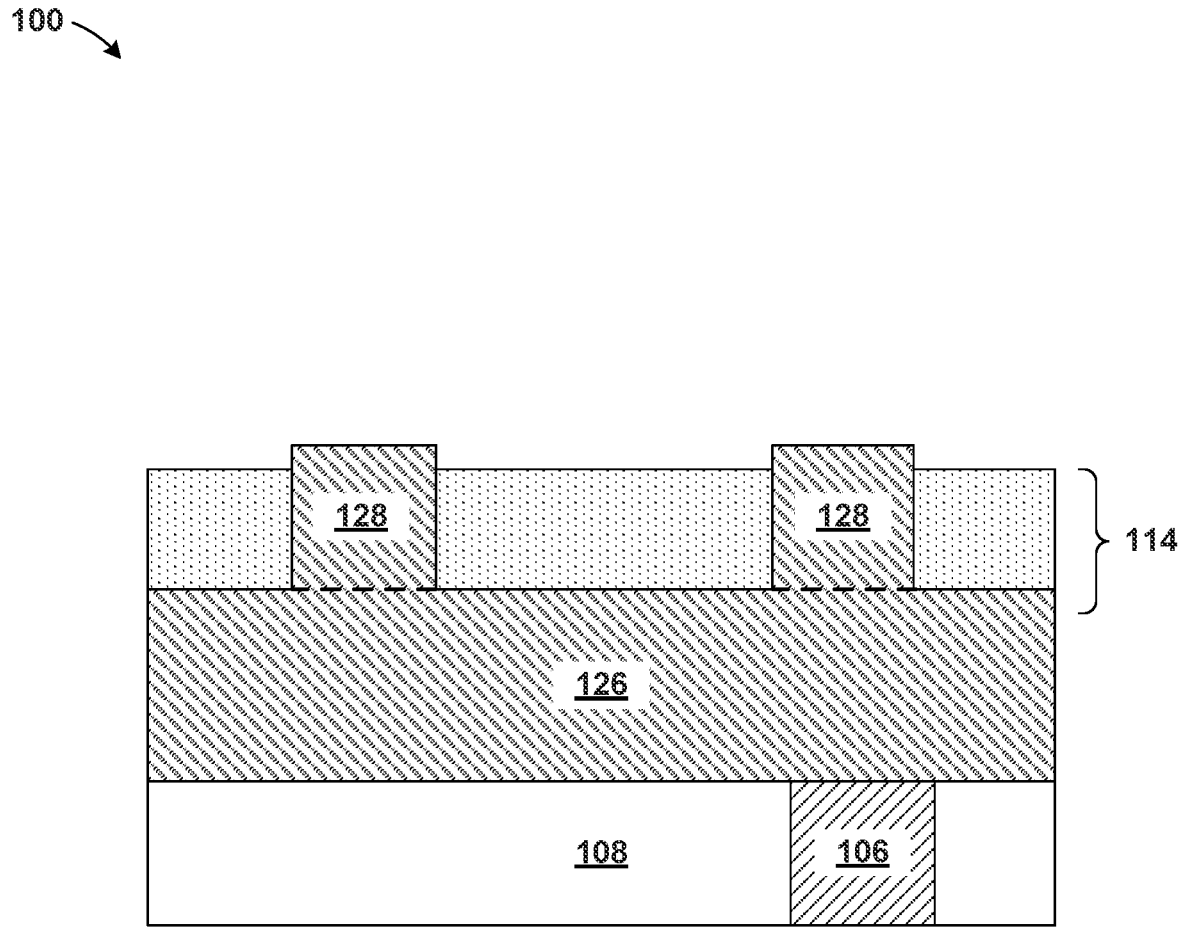

Referring now to FIGS. 19, 20, 21, 22, and 23, the structure 100 is shown after removing hard mask layer 134 and subsequently removing the metal layer 112 to form voids 140 and trenches 142 in accordance with an embodiment of the present invention. More specifically, FIG. 19 illustrates a top view of the structure 100, FIG. 20 illustrates a cross-section view of the structure 100 along section line A-A, FIG. 21 illustrates a cross-section view of the structure 100 along section line B-B, FIG. 22 illustrates a cross-section view of the structure 100 along section line C-C, and FIG. 23 illustrates a cross-section view of the structure 100 along section line D-D.

First, the hard mask layer 134 is removed according to know techniques. Next, the metal layer 112 is removed through access windows 144 created by transferring the block mask pattern 138 into the dielectric layer 114. The metal layer 112 is removed selective to the dielectric layer 114, the liners 120, the metal lines 126, the top vias 128, and the cap layer 110 creating voids 140. Removal of metal layer 112 may be performed using at least one wet etching technique to dissolve and remove all of the metal layer 112. It is critical to remove all of the metal layer 112 to avoid or prevent shorting between adjacent interconnects 122. In doing so, for example, a hydrofluoric acid etch can be used when the first metal layer 112 is composed of aluminum oxide ($AlO_x$). Alternatively, for example, a hot peroxide etch mixture with ammonium hydroxide bases can be used when the first metal layer 112 is composed of titanium nitride (TiN).

After performing the wet etch, a depth of the voids 140 is approximately equal to a height of the interconnects 122, or combined height of the metal lines 126 and the vias 128. More importantly, it is a critical feature of the present invention that a relative width at a bottom of the voids 140 is larger than a relative width at a top of the voids 140. Stated differently, a lateral distance between the dielectric layer 114 and the via 128 is smaller than a lateral distance between adjacent metal lines 126.

Further, the relative width of the voids 140 measured at the top of the voids 140, at the access window 144, must be small or narrow enough to prevent subsequent deposition of non-conformal dielectrics from filling the voids 140 as described below. Additionally, the relative width of the voids 140 measured at the bottom of the voids 140 is approximately equal to the lateral spacing between the metal lines 126, or interconnects 122, which may be driven by lithography limitations, ground rules, or both, as discussed above. Such dimensional configurations are accomplished by the block mask design and the patterned dielectric layer 114. Without the patterned dielectric layer 114, the lateral spacing between adjacent interconnects 122 is too large and would prevent the formation of air gaps as described below.

It is further observed after performing the wet etch, the patterned dielectric layer 114 is substantially preserved and adjacent interconnects 122 are no longer separated by the meal layer 112. Despite portions of the patterned dielectric layer 114 appearing relatively unsupported in the cross-section views, the patterned dielectric layer 114 remains a blanket layer with access "holes" or openings corresponding to the block mask pattern 138. Even more specifically, the critical sidewall contact 132 between the liners 120 of the metal lines 126 and the dielectric layer 114 prevent the remaining patterned portions of the dielectric layer 114 from collapsing.

Figure 24:
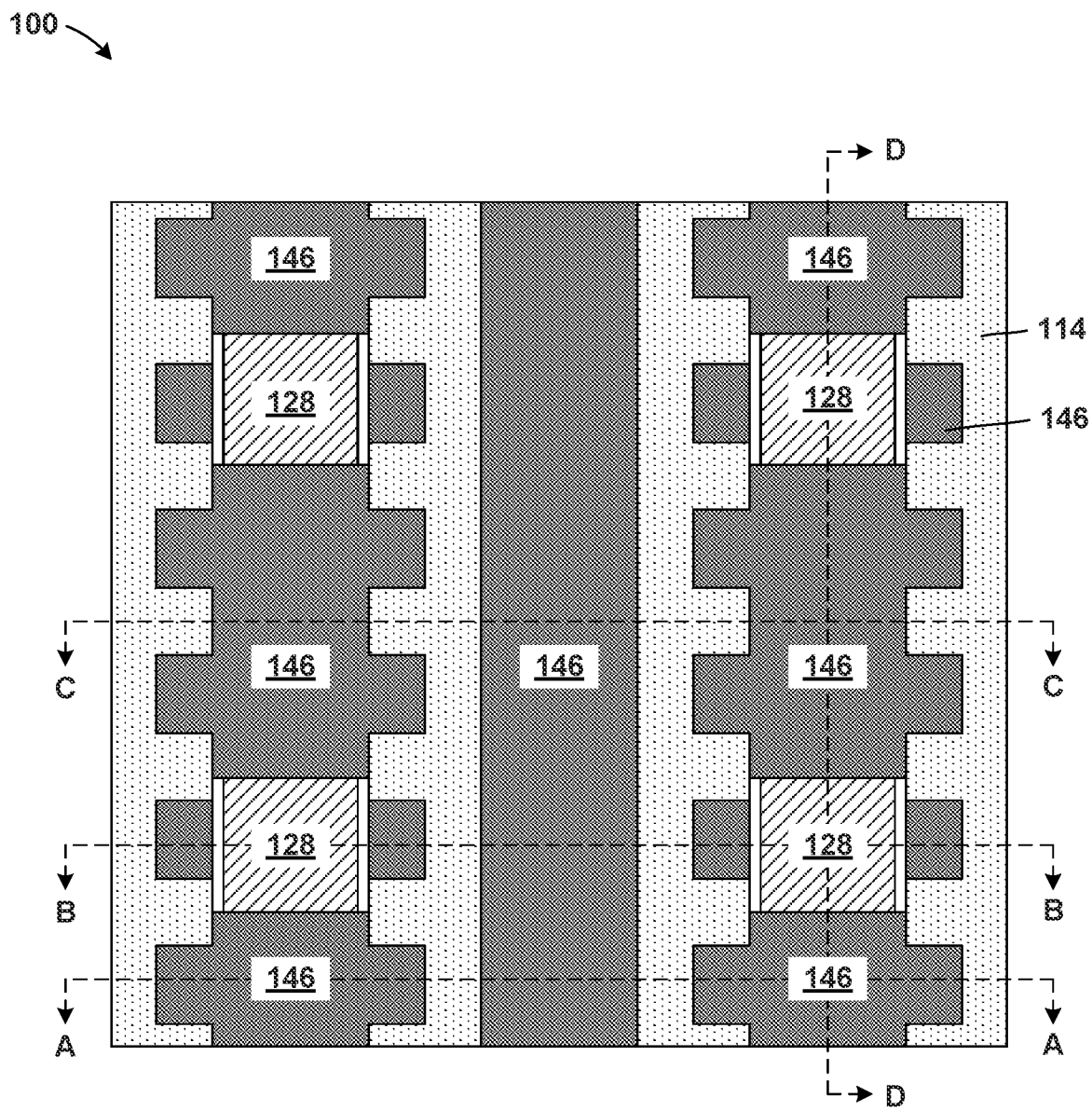
FIGS. 24, 25, 26, 27, and 28, illustrate various views of the semiconductor structure after forming a non-conformal dielectric layer according to an exemplary embodiment.
Figure 25:
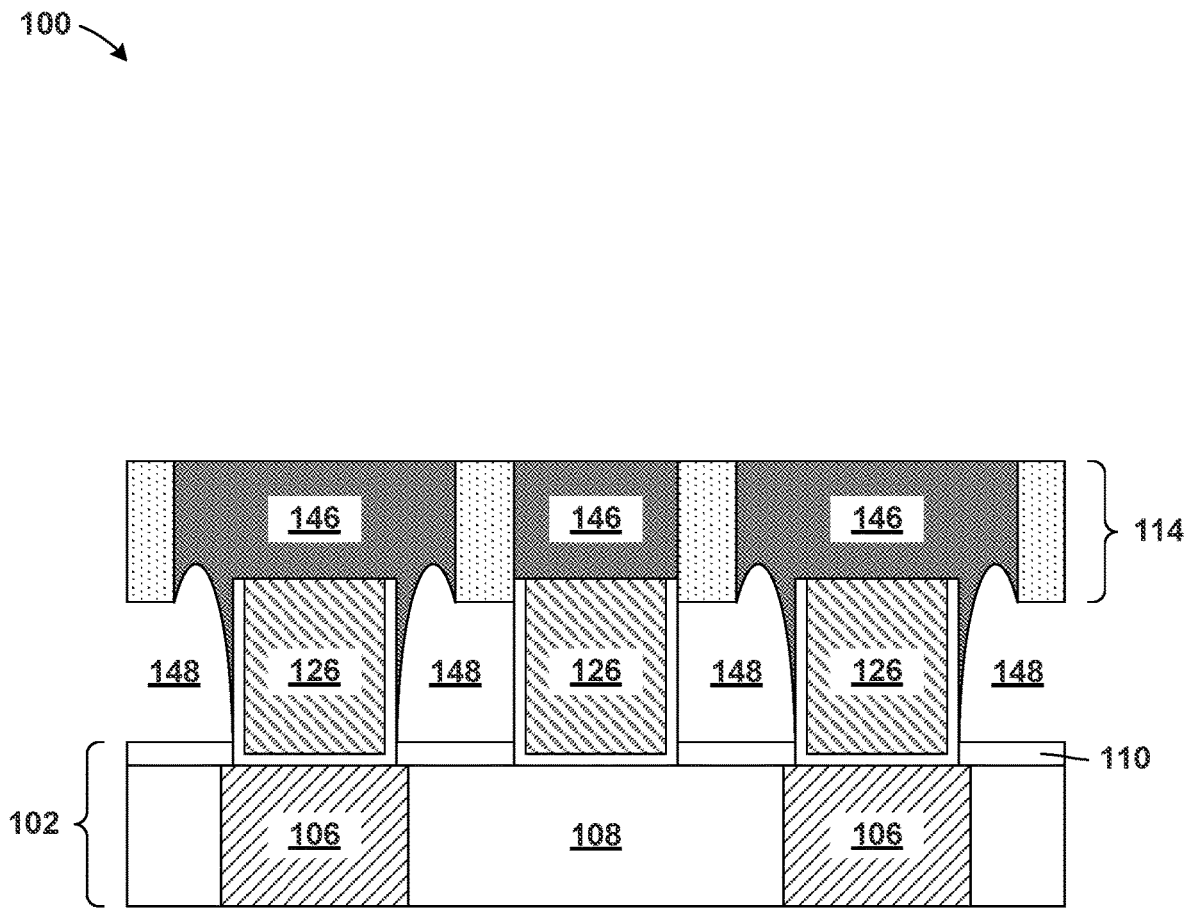
Figure 26:
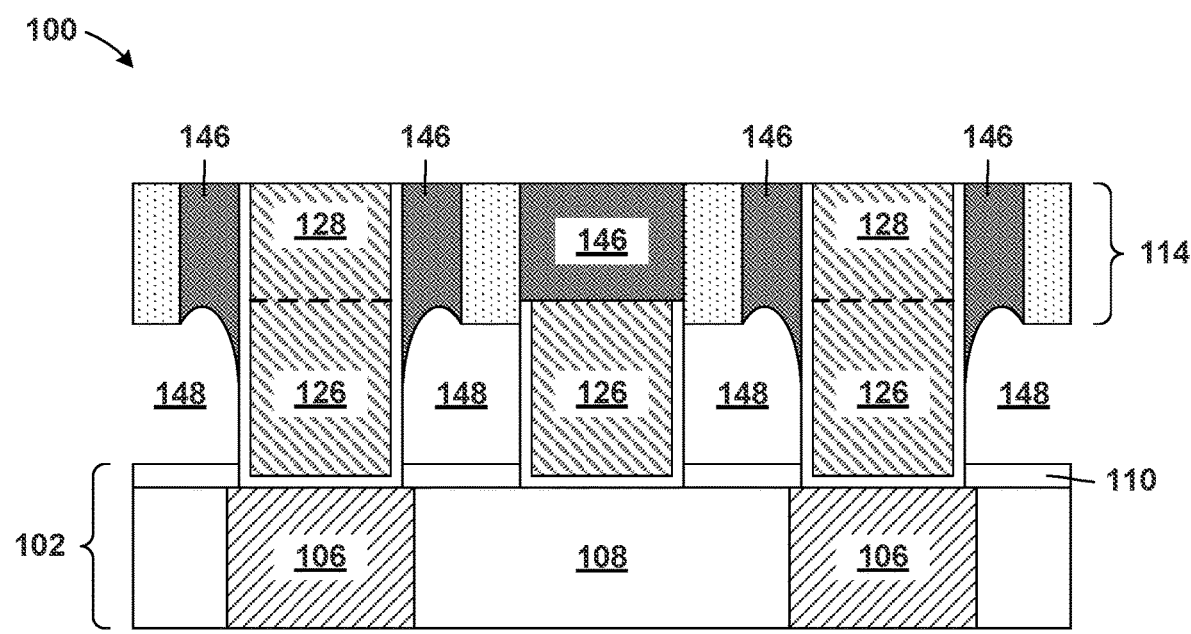
Figure 27:
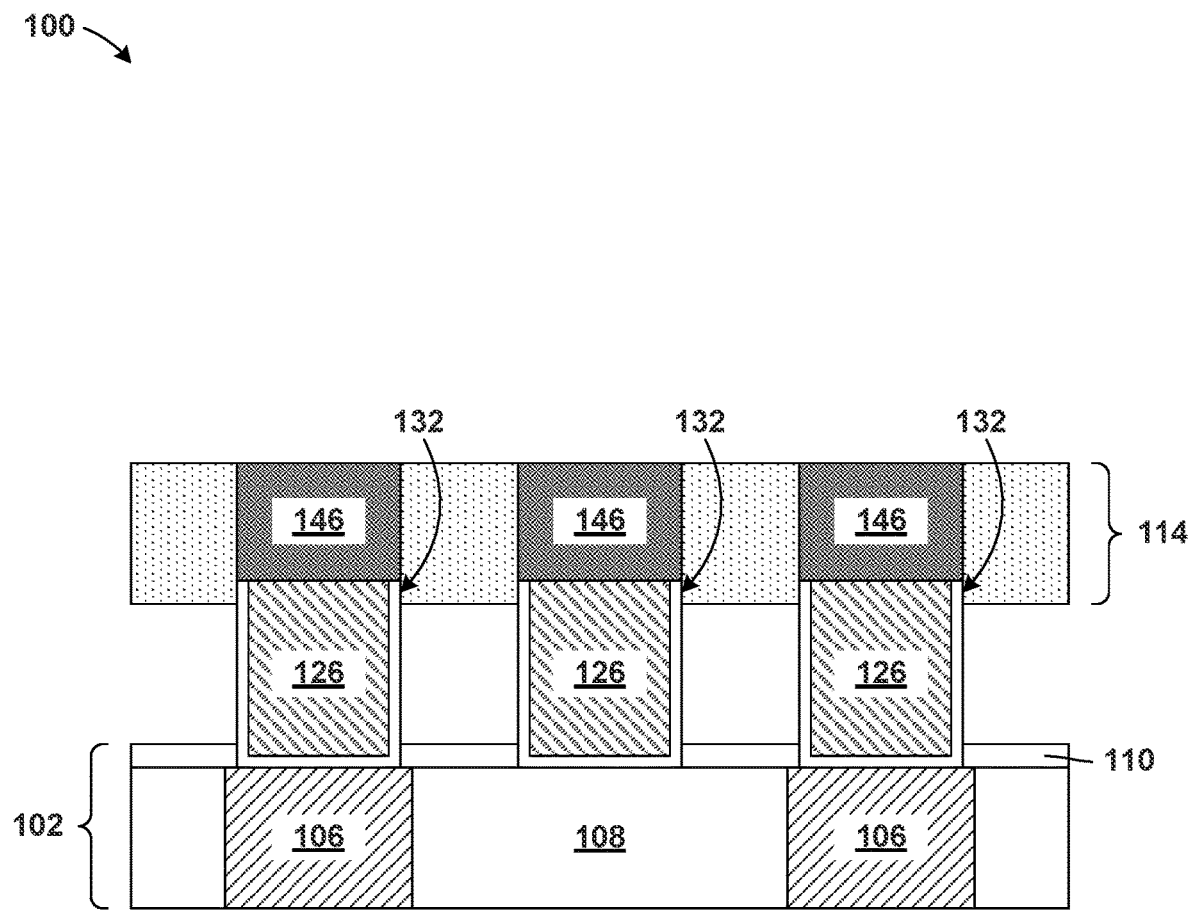
Figure 28:
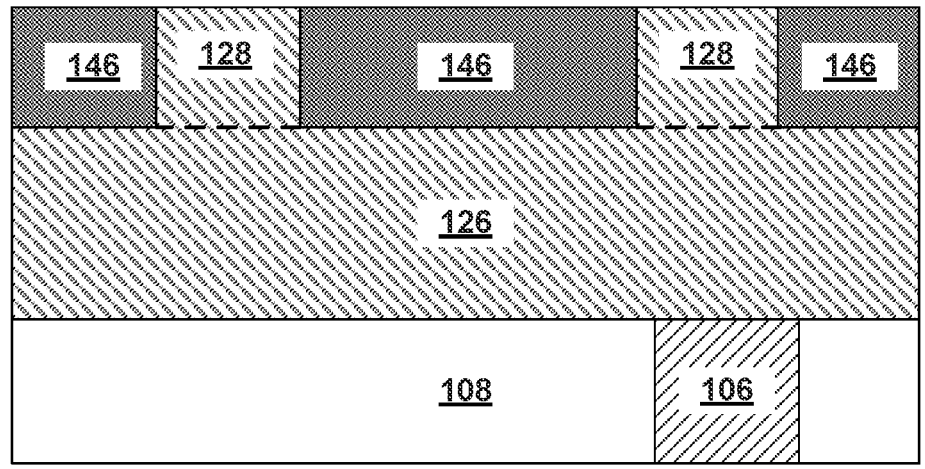

Referring now to FIGS. 24, 25, 26, 27, and 28, the structure 100 is shown after forming a non-conformal dielectric layer 146 in accordance with an embodiment of the present invention. More specifically, FIG. 24 illustrates a top view of the structure 100, FIG. 25 illustrates a cross-section view of the structure 100 along section line A-A, FIG. 26 illustrates a cross-section view of the structure 100 along section line B-B, FIG. 27 illustrates a cross-section view of the structure 100 along section line C-C, and FIG. 28 illustrates a cross-section view of the structure 100 along section line D-D. In doing so, the non-conformal dielectric layer 146 is blanket deposited across exposed surfaces of the structure 100, and air gaps 148 are formed as illustrated.

Pinch-off occurs relatively early in the deposition of the non-conformal dielectric layer 146 preventing the voids 140 from filling with dielectric material. More specifically, the relative width of the voids 140 measured at the top of the voids 140 is narrow enough to cause the non-conformal dielectric layer 146 to pinch off before material is deposited along lower sidewalls of the interconnects 122, and specifically exposed sidewalls of the liners 120. As a result, the amount of dielectric material covering the sidewalls of the of the liners 120, within the voids 140, is minimized and air gaps 148 are formed. Additionally, pinch-off caused by the relatively narrow opening at a top the void 140 will produce a concave profile along a bottom portion of the non-conformal dielectric layer 146, as illustrated. Finally, some embodiments will include in a small or relatively thin layer of the non-conformal dielectric layer 146 on lower sidewalls of the interconnects 122, and the lateral thickness of the thin layer of the non-conformal dielectric layer 146 will decrease as depth into the void 140 increases.

Meanwhile, in some embodiments, the non-conformal dielectric layer 146 fills the trenches 142 directly above the lines 126. Alternatively, in other embodiments, the trenches 142 may have similar dimensions to the voids 140 and experience similar pinch-off as described above. In such cases, a relatively small air gap may additionally form beneath the non-conformal dielectric layer 146 in the trenches 142.

Finally, a chemical mechanical polishing technique is used to remove excess unwanted dielectric material from the non-conformal dielectric layer 146 from upper surfaces of the structure 100. As a result, the non-conformal dielectric layer 146 is vertically aligned with the dielectric layer, or otherwise they are in the same level. Further, upper surfaces of the via 128, the non-conformal dielectric layer 146, and the dielectric layer 114 are substantially flush.

In general, the non-conformal dielectric layer 146 may include any known dielectric material deposited in a non-conformal manner and designed to pinch off the voids 140 in a manner illustrated and described above. For example, the non-conformal dielectric layer 146 may include any suitable dielectric material, for example, oxide, nitride, silicon oxide ($SiO_2$), silicon nitride ($Si_3N_4$), hydrogenated silicon carbon oxide (SiCOH), carbon rich silicon carbon nitride (SiCN), silicon based low-κ dielectrics, porous dielectrics, or some combination thereof.

The non-conformal dielectric layer 146 may be formed by any non-conformal deposition technique of a desired dielectric material. Such a non-conformal deposition of the dielectric material may include a depletive chemical vapor deposition (CVD) in which the deposition rate of the dielectric material is limited by supply of reactants in addition to the time, temperature and pressure of the reaction.

When reactants are depleted in a chemical vapor deposition process, the thickness of the deposited material depends on the proximity of the surface at which deposition is made to the source of reactant supply. More dielectric material is deposited on a surface close to the source of the reactant supply than on a surface removed from the source of the reactant supply by a distance. For example, the closer a position on the sidewalls of the voids 140 to the top surface of the structure 100, the thicker the non-conformal dielectric layer 146 will be at that position. Therefore, a lateral thickness of the non-conformal dielectric layer 146 deposited along the sidewall of the voids 140 may decrease as the distance from the top surface of the structure 100 increases. Normally increasing the process temperature would substantially increase the reaction rate and further ensure that pinch off occurs at or near a top of the voids 140. In this case, pinch off is a desirable result.

As such, the portion of the non-conformal dielectric layer 146 deposited along the sidewall of the voids 140 may have a thickness that decreases with distance from the top surface of the structure 100. Typically, as the distance from the top surface of the structure 100 increases, the lateral thickness of the non-conformal dielectric layer 146 decreases. The lateral thickness of the non-conformal dielectric layer 146 may become zero at or above an upper surface of the interconnect 122b or a lower most surface of the dielectric layer 114. The lateral thickness, or width, of the non-conformal dielectric layer 146 measured at the top of the void 140 will be equal to the width of the top of the void 140 forming the air gaps 148.

It is a critical feature of the present embodiment that the lateral thickness of the non-conformal dielectric layer 146 preferably decrease to zero before reaching the bottom of the void 140, as illustrated. More specifically, it is a critical feature of the present embodiment that the thickness of the non-conformal dielectric layer 146 preferably decrease to zero before reaching the bottom of the void 140 and a only a small amount of dielectric material is deposited along sidewalls of the interconnects 122, and likely wise the liners 120, below the dielectric layer 114.

Exemplary depletive CVD processes include, but are not limited to high temperature higher pressure CVD (HPHT CVD), plasma enhanced chemical vapor deposition (PECVD), high density plasma chemical vapor deposition (HDPCVD), rapid thermal chemical vapor deposition. Higher pressure is roughly defined as pressure greater than tens of Torr. The dielectric material of the non-conformal dielectric layer 146 may be silicon dioxide, undoped silicate glass (USG), borosilicate glass (BSG), phosphosilicate glass (PSG), arsenosilicate glass (ASG), borophosphosilicate glass (BPSG), silicon nitride, silicon oxynitride, and a combination thereof. The various silicate glass materials may be deposited employing tetra-ortho-ethyl-silicate (TEOS) as a precursor. Ozone environment may be provided to deposit a silicate glass material with the TEOS as the precursor to deposit an "ozone TEOS" oxide material. Another exemplary processes is an ozone TEOS process that forms an undoped silicate glass (USG) material.

In an embodiment, the non-conformal dielectric layer 146 may be formed using an HPHT CVD technique. The HPHT CVD technique may be used to deposit silicon dioxide, silicon nitride or silicon oxynitride using a silane or dichlorosilane and ammonia precursor. In particular, the HPHT CVD technique may be carried out at a temperature higher than about 700° C. and a pressure higher than atmosphere. Typically, low pressure techniques may be used to provide good conformal step coverage, for example, depositing a node dielectric; however, a typical low pressure CVD technique would normally deposit material at the bottom of the voids 140 In general, HPHT deposition techniques are extremely anisotropic and have very poor conformal step coverage and are typically used when deposition of a particular material is required on a top surface only and not along any vertical sidewall, and thus would not typically be used to achieve the disclosed results. Furthermore, HPHT techniques are not typically used to deposit dielectric materials, such as oxide or nitrides.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a first metal line;
   a top via above and directly contacting the first metal line;
   a second metal line adjacent to the first metal line;
   a first dielectric contacting sidewalls of the top via;
   a second dielectric directly between the first dielectric and the second metal line, wherein upper surfaces of the top via, the first dielectric, and the second dielectric are substantially flush; and
   an air gap located between the first metal line and the second metal line, and below both the first dielectric and the second dielectric.

2. The semiconductor structure according to claim 1, further comprising:
   an underlying metal layer comprising conductors below and in electrical contact with the first metal line.

3. The semiconductor structure according to claim 1, wherein the air gap directly contacts sidewalls of the first metal line and sidewalls of the second metal line.

4. The semiconductor structure according to claim 1, wherein a sidewall of the second dielectric directly contacts a sidewall of the second metal line.

5. The semiconductor structure according to claim 1, wherein a bottom surface of first portions of the first dielectric is concave, and a bottom surface of second portions of the first dielectric contacts an upper surface of the second metal line.

6. The semiconductor structure according to claim 1, wherein a bottom surface of the second dielectric is below a top surface of both the first metal line and the second metal line.

7. The semiconductor structure according to claim 1, wherein the first metal line and the top via consist of a homogenous conductive material.

8. A semiconductor structure comprising:
   a first metal line;
   a top via above and directly contacting the first metal line;
   a second metal line adjacent to the first metal line;
   a first dielectric contacting sidewalls of the top via;
   a second dielectric between the first dielectric and the second metal line, wherein upper surfaces of the top via, the first dielectric, and the second dielectric are substantially flush; and
   an air gap located between the first metal line and the second metal line, and below both the first dielectric and the second dielectric,
   wherein a lateral distance between the second dielectric and the top via is smaller than a lateral distance between the first metal line and the second metal line.

9. The semiconductor structure according to claim 8, further comprising:
   an underlying metal layer comprising conductors below and in electrical contact with the first metal line.

10. The semiconductor structure according to claim 8, wherein the air gap directly contacts sidewalls of the first metal line and sidewalls of the second metal line.

11. The semiconductor structure according to claim 8, wherein a sidewall of the second dielectric directly contacts a sidewall of the second metal line.

12. The semiconductor structure according to claim 8, wherein a bottom surface of first portions of the first dielectric is concave, and a bottom surface of second portions of the first dielectric contacts an upper surface of the second metal line.

13. The semiconductor structure according to claim 8, wherein a bottom surface of the second dielectric is below a top surface of both the first metal line and the second metal line.

14. The semiconductor structure according to claim 8, wherein the first metal line and the top via consist of a homogenous conductive material.

15. A semiconductor structure comprising:
a first metal line;
a top via above and directly contacting the first metal line, wherein the first metal line and the top via consist of a homogenous conductive material;
a second metal line adjacent to the first metal line;
a first dielectric contacting sidewalls of the top via;
a second dielectric between the first dielectric and the second metal line, wherein a sidewall of the second dielectric directly contacts a sidewall of the second metal line, wherein upper surfaces of the top via, the first dielectric, and the second dielectric are substantially flush; and
an air gap located between the first metal line and the second metal line, and below both the first dielectric and the second dielectric,
wherein a lateral distance between the second dielectric and the top via is smaller than a lateral distance between the first metal line and the second metal line.

16. The semiconductor structure according to claim 15, wherein a bottom surface of first portions of the first dielectric is concave, and a bottom surface of second portions of the first dielectric contacts an upper surface of the second metal line.

17. The semiconductor structure according to claim 15, wherein a bottom surface of the second dielectric is below a top surface of both the first metal line and the second metal line.

* * * * *